(12) United States Patent
James et al.

(10) Patent No.: US 7,680,369 B2
(45) Date of Patent: Mar. 16, 2010

(54) OPTICAL FIBRE SWITCHING ASSEMBLY

(75) Inventors: Jonathan Horton James, Cambridge (GB); Andrew Nicholas Dames, Cambridge (GB)

(73) Assignee: Polatis Limited, Cambridge (GB)

( * ) Notice: Subject to any disclaimer, the term of this patent is extended or adjusted under 35 U.S.C. 154(b) by 799 days.

(21) Appl. No.: 11/133,157

(22) Filed: May 19, 2005

(65) Prior Publication Data

US 2006/0002654 A1 Jan. 5, 2006

Related U.S. Application Data

(63) Continuation-in-part of application No. 10/169,782, filed as application No. PCT/GB01/00062 on Jan. 5, 2001, now Pat. No. 7,106,925.

(30) Foreign Application Priority Data

| Jan. 6, 2000 | (GB) | ................................... 000026.3 |
| Nov. 13, 2000 | (GB) | ................................ 0027745.9 |
| Dec. 4, 2000 | (GB) | ................................ 0029439.7 |

(51) Int. Cl.
   *G02B 6/35* (2006.01)
(52) U.S. Cl. ........................................... 385/19; 385/90
(58) Field of Classification Search ............. 385/18–19, 385/90–91
   See application file for complete search history.

(56) References Cited

U.S. PATENT DOCUMENTS

| 3,941,927 | A | 3/1976 | Russell |
| 4,512,036 | A | 4/1985 | Laor |
| 4,651,343 | A | 3/1987 | Laor |
| 4,657,339 | A | 4/1987 | Fick |
| 4,696,062 | A | 9/1987 | LaBudde |
| 5,135,295 | A | 8/1992 | Jen |
| 5,479,541 | A | 12/1995 | Pan |
| 5,524,153 | A | 6/1996 | Laor |
| 5,611,009 | A | 3/1997 | Pan |
| 5,727,098 | A | 3/1998 | Jacobson |
| 5,727,099 | A * | 3/1998 | Harman ...................... 385/52 |
| 5,864,643 | A | 1/1999 | Pan |
| 6,005,998 | A | 12/1999 | Lee |
| 6,549,703 | B1 | 4/2003 | Tanielian |
| 2003/0128912 | A1 | 7/2003 | Dames |

FOREIGN PATENT DOCUMENTS

| DE | 197 06 053 | 8/1998 |
| JP | 59024804 | 2/1984 |
| WO | WO-98/35257 | 2/1998 |
| WO | WO-99/37013 | 7/1999 |

* cited by examiner

*Primary Examiner*—Jerry T Rahll
(74) *Attorney, Agent, or Firm*—Workman Nydegger

(57) ABSTRACT

An optical beam steering arrangement, comprises: a moveable optical element; actuating means for causing the movement of said element; a connecting means between said element and said actuating means for transmitting movement from said actuating means to said element; and flexure means which carry said optical element and are compliant with the displacement of said optical element.

21 Claims, 25 Drawing Sheets

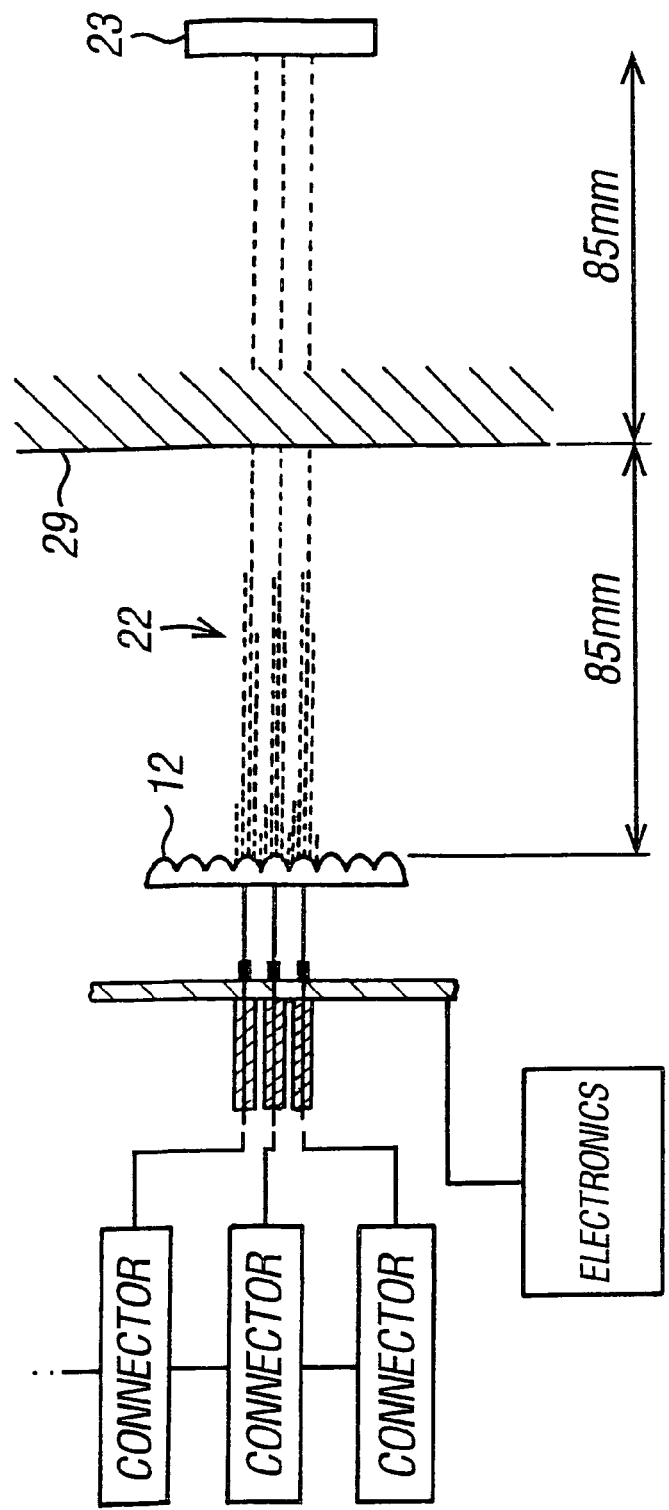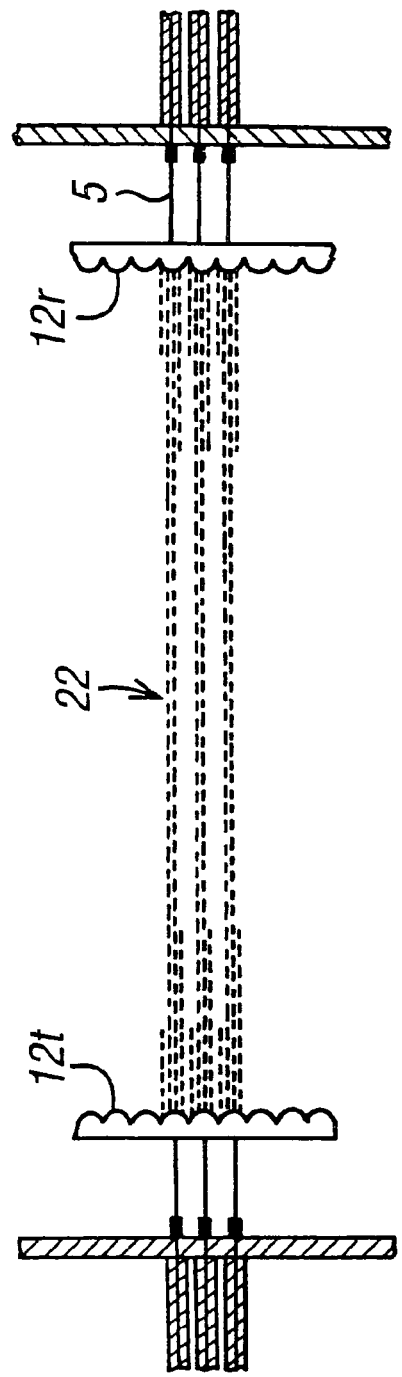
FIG. 10
FIG. 11

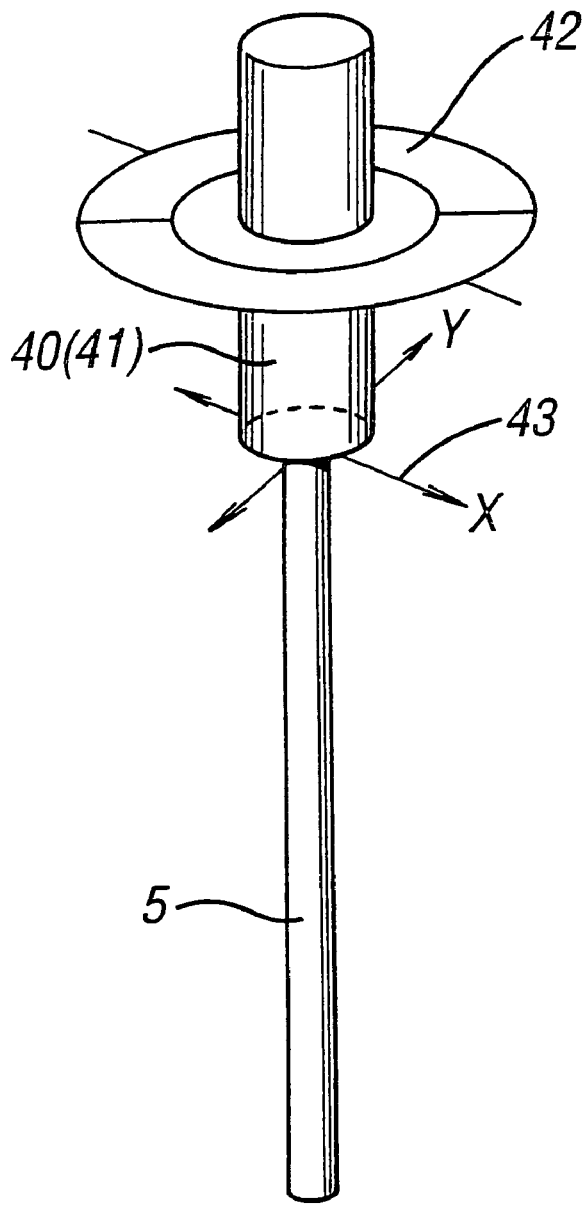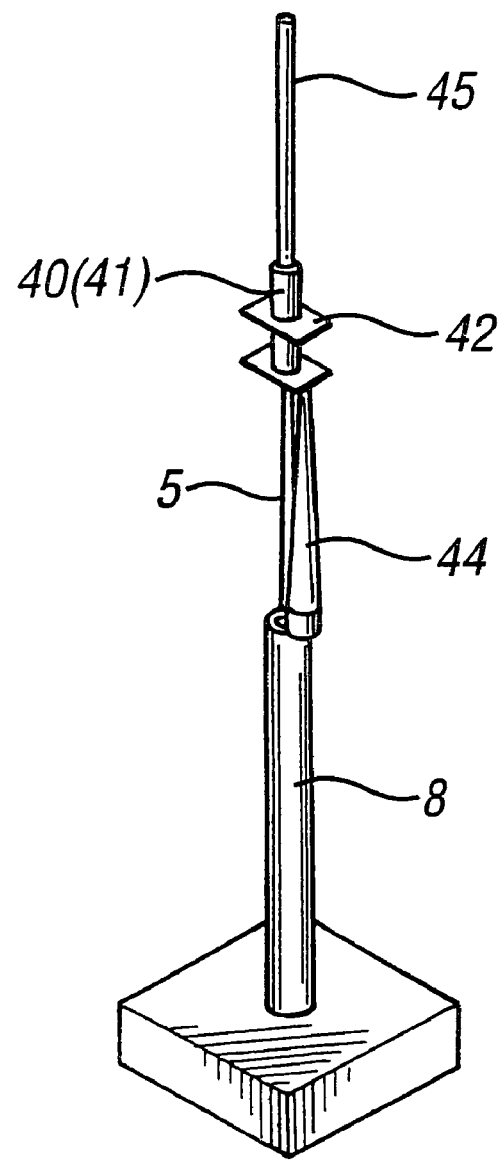

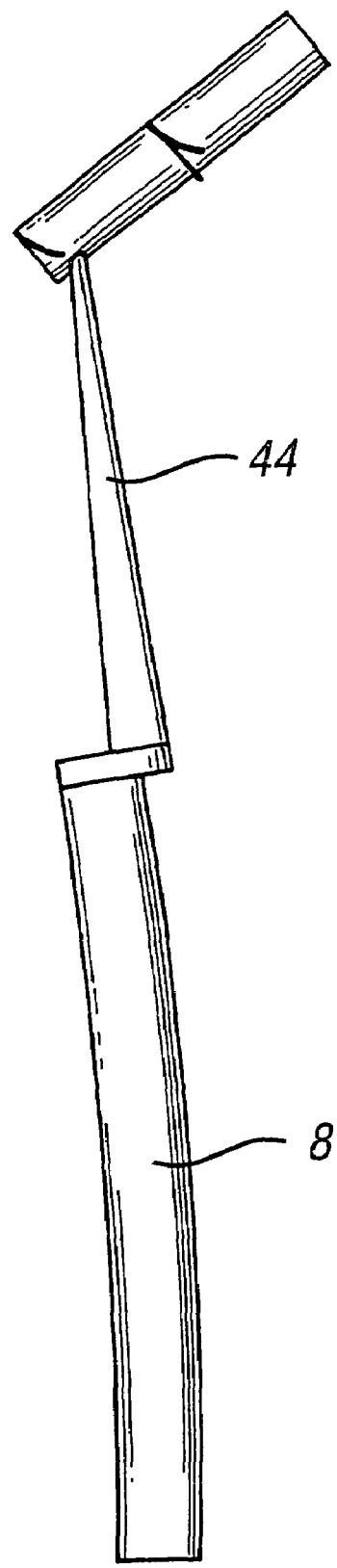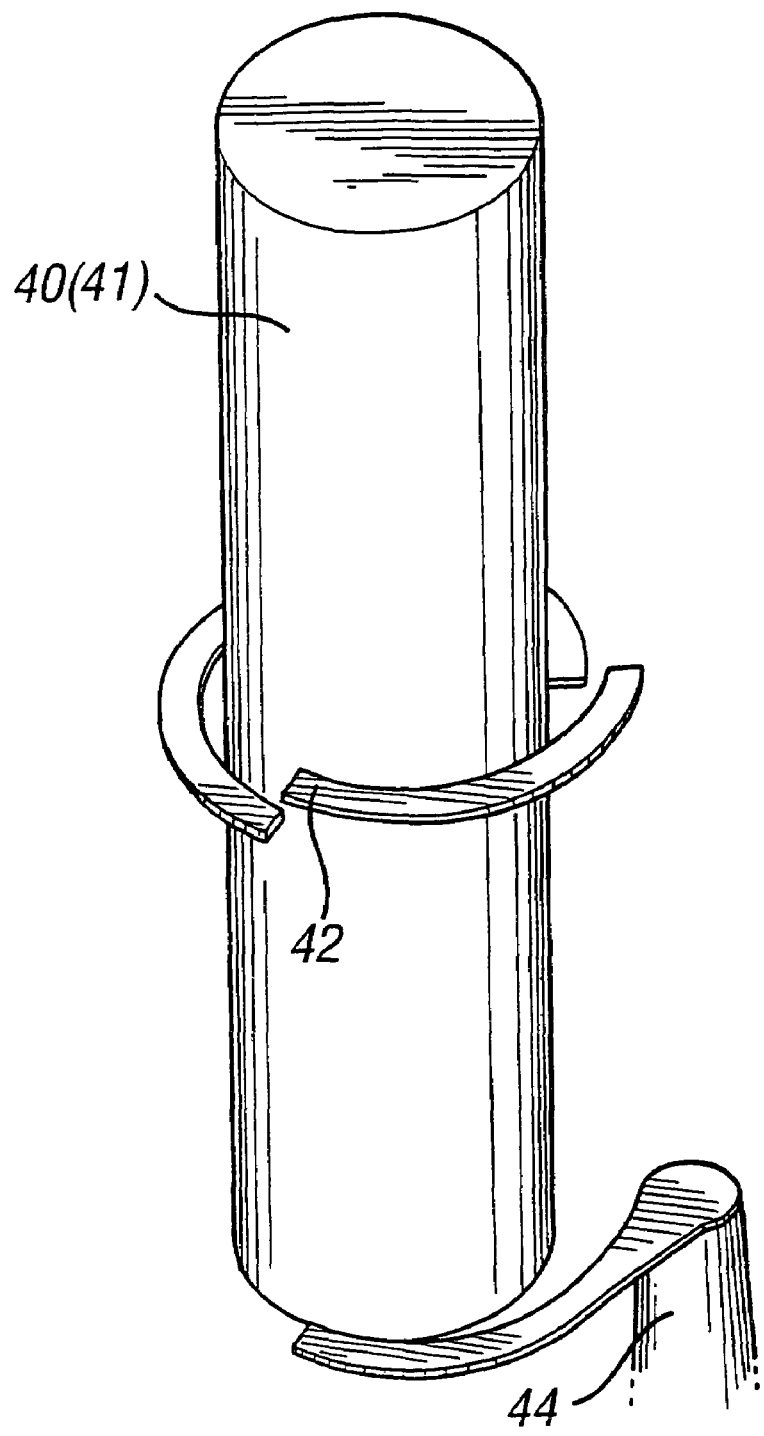

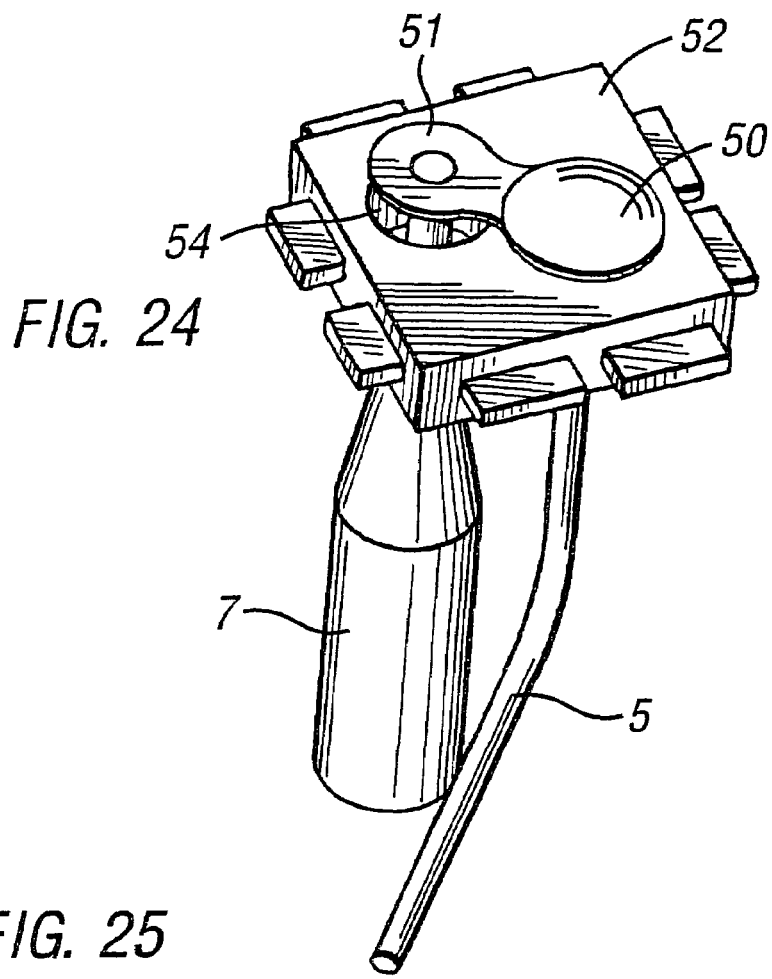
FIG. 24
FIG. 25
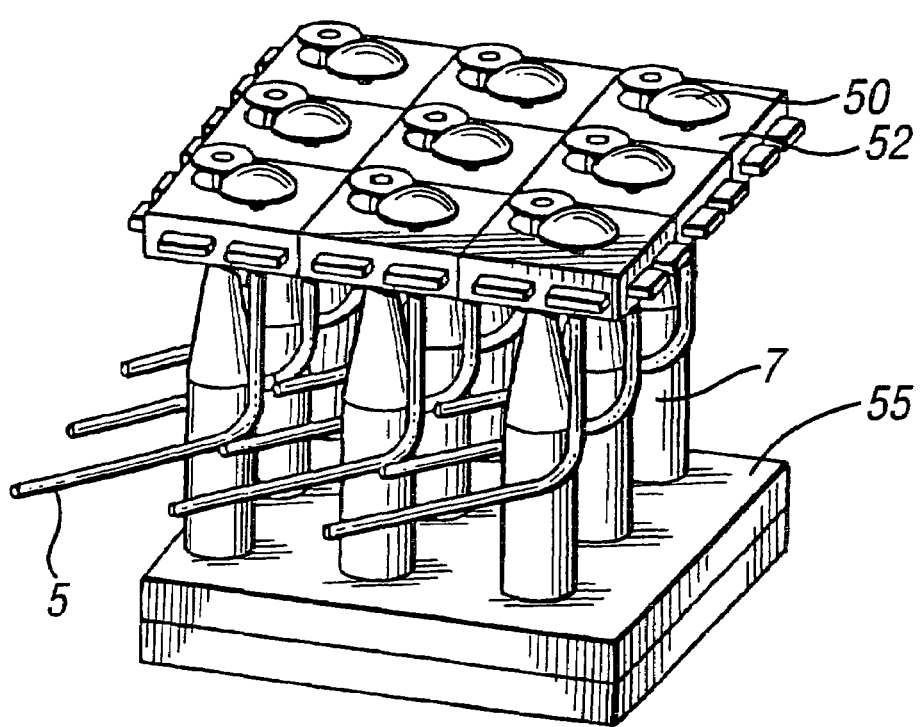

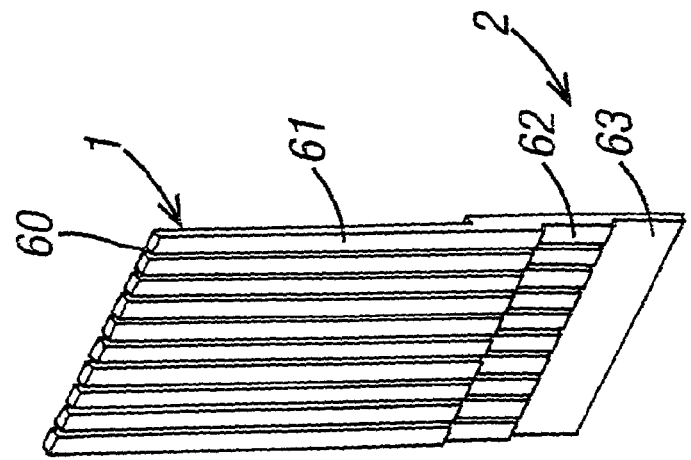
FIG. 27
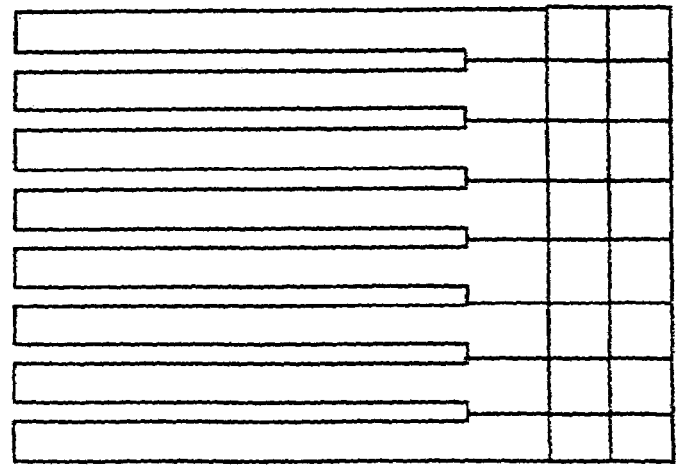

OPTICAL FIBRE SWITCHING ASSEMBLY

This invention relates to an optical guide switching assembly and to steering devices used in the assembly for deflecting radiation from a transmitting guide in order to direct the radiation to a selected receiving guide.

One of the major problems facing the invention is to provide rapid switching with low insertion loss (high coupling efficiency and low cross talk) for high port counts, whilst evolving a compact design which can be readily manufactured. A related problem is to increase the switching capacity of an optical fibre switching assembly, without the expense of an increase in physical size. At least preferred embodiments of the invention have been especially designed to deal with these problems.

According to the main aspect of the invention, an optical beam switching assembly comprises:

(a) a first set of optical guides spaced from a second set of optical guides;

and (b) respective steering devices for causing deflection of a beam of optical radiation from a selected transmitting guide in the first set so that it is received by a selected receiving guide in the second set;

characterised in that each of said devices comprises collimating means for collimating light from said transmitting guide and means for moving said collimating means or for causing relative movement between said collimating means and said transmitting guide to cause said deflection.

Advantages of the latter arrangement include greater deflection for a comparatively smaller movement (of either the collimating means, or the transmitting guide) and higher switching speeds due to comparatively lower inertia. For example, in the case where an end portion of optical fibre is subject to traverse movement to deflect an emergent beam, the end portion has less inertia and a wider deflection is possible at higher speed. This is also beneficial in designing a switching assembly having a high packing density of (eg.) optical fibres.

The optical guide can be, for example, an optical fibre which conducts laser light, or a waveguide made of silicon or other dielectric material which conducts infrared light. These guides, (for example, optical fibres) can be arranged in the switching assembly so that emergent beams of radiation are projected directly across a space, i.e. between separated sets of transmitting and receiving optical fibres. Alternatively, they can be arranged in the same array where beams of radiation are projected from sets of transmitting optical fibres to a reflector, which then reflects the beams back to receiving optical fibres. (Reference made herein to optical fibres is by way of example only and can be taken to cover other forms of optical guide).

The steering device can include, for example, a piezo electric transducer for deflecting an end portion of a transmitting fibre so that the radiation (which exits from the fibre) is caused to move in the focal plane of a collimating lens. Alternatively, the end of the transmitting fibre can be fixed and a collimating lens can be moved with respect thereto, so that the focal plane of the lens is moved around the end of the fibre to produce the same effect. Alternatively, the end of the transmitting fibre can have a collimating lens either integral therewith, or attached thereto, so that the fibre and the lens can move together to produce the same effect.

Instead of using a piezo electric transducer, electrostatic deflection means can be used either to move a fibre with respect to a fixed lens, or to move a lens with respect to a fixed fibre. For example, the surface of the end portion of the fibre can be metallised or given some other conductive coating, so that it forms one electrostatic moveable 'plate' which co-operates with fixed electrostatic 'plates' adjacent the moveable 'plate'.

Where a piezo electric transducer is used to cause movement, it can be of a 'foil type', where fingers of a comb-like array of piezo transducers are attached to actuating members, such as foil strips, for producing orthogonal displacement of either the optical fibre or the lens system. Such foils and combs can be assembled in a laminar matrix.

Alternatively, the piezo electric transducer can be of a 'monolithic type', where each transducer is made of piezo electric material, it has a body with a longitudinal axis, and the body has conductive strips aligned with said longitudinal axis so as to define respective portions of the piezo electric transducer which are energised to impart respective transverse movements in different radial directions. This provides a resultant motion in orthogonal axes. A multiplicity of such bodies can be assembled in a columnar matrix. The body can have a bore aligned with its longitudinal axis in which the fibre is received, whereby bending of the fibre occurs with respect to said longitudinal axis. Alternatively, the body is attached to the collimating lens which moves relative to a fixed fibre.

This 'foil type' and 'monolithic type' which are described in more detail below, can be designed to provide greater beam deflection than prior art arrangements, with less inertia, to achieve more rapid switching between a greater number of fibres and also to provide a higher packing density of fibres.

Preferably, position sensing feedback means are employed for sensing the amount of movement and for providing a feedback signal. This is used in a control system which energises the transducers to ensure that the transmitted radiation is aimed at the correct receiver fibre for making the required switching connection.

Preferably, a capacitive feedback system is used. For example, the fibre end has a conductive coating (as one 'capacitor plate') and it moves with respect to fixed conductive tracks (acting as the other 'capacitor plate'). The term 'capacitor plate' applies generally to any member, surface, or structure which, together with the intervening 'dielectric' (which could be air, liquid or gaseous fluid, or some other dielectric material), forms a good capacitive coupling between fixed and moving elements. Such 'plates' can therefore take various forms, eg. they can be flat, curved or parts of some structure having some inherent capacitive properties. In another example, a lens system or optical collimator, having an associated 'capacitor plate' moves with respect to a fixed fibre end, having an associated 'capacitor plate'.

In a preferred embodiment of the invention, conductive tracks on insulating boards are arranged in layers to form one set of fixed capacitive plates of a position sensing feedback system; the moving end portions of respective fibres having conductive coatings to form the other plates. Alternatively, a conductive plates moves with a lens and another conductive plate is fixed with the fibre. These tracks can cross orthogonally so that pairs of conductive tracks, associated with individual fibres, can be polled or addressed so as to sense the change in capacity proportional to the relative displacement between the fibre ends and the lens systems. In a preferred embodiment, a diagonal addressing system is used which can be selectively energized and switched in order to detect an instantaneous capacitive value relating to the amount of beam deflection.

When using the monolithic type of (piezo electric material) transducer, its rod-like form may be comparatively short and thick whereby bending is limited with respect to the longitudinal axis. In this case, mechanical leverage means can be used so as to magnify the transducer movement before imparting motion to cause relative movement between the collimating lens and the end portion of the fibre, or to move the end portion of the fibre to which a collimator lens is attached or forms an integral part. Preferably, such leverage means includes a gimbal mounting and an extension rod located between the end of the body of the piezo electric material transducer and a point on the gimbal spaced from its pivotal axis. In the latter case, where the collimator is part of or attached to the fibre end, the gimbal mounting is preferably on the body of the collimator to provide optimum deflection of the emergent beam.

Embodiments of the invention will now be described with reference to the accompanying drawings in which.

Figure 5:
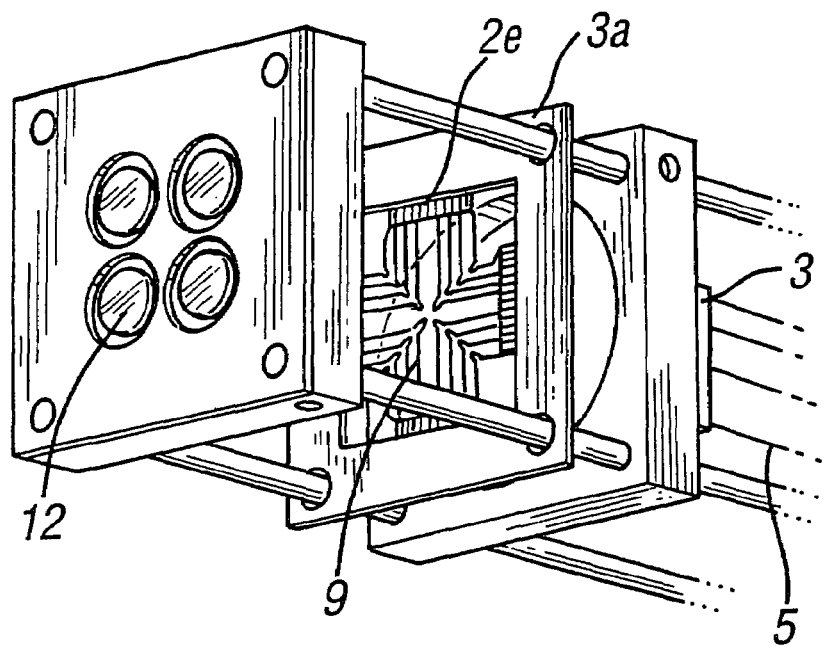
Figure 6:
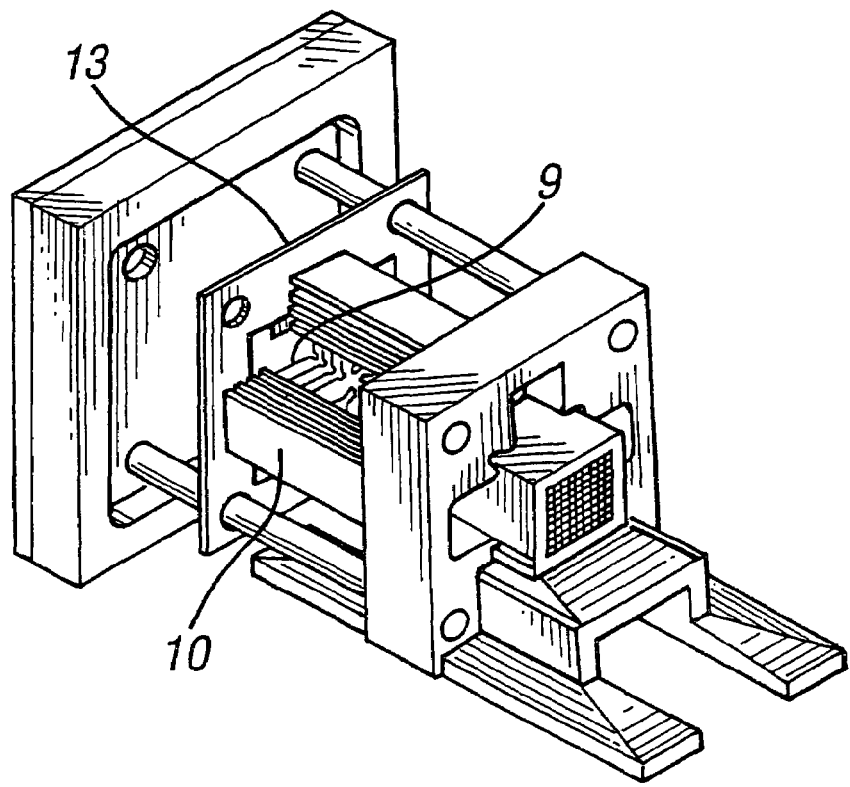
Figure 7A:
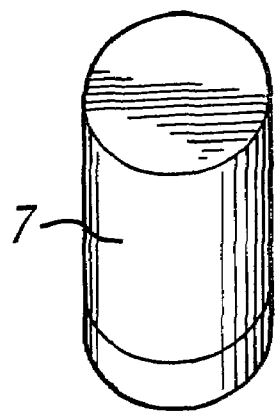
Figure 7B:
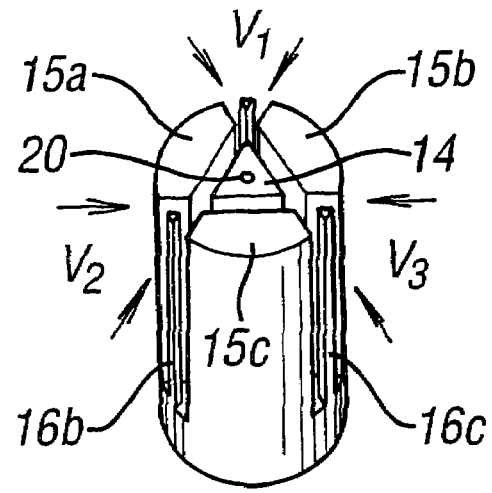
Figure 7C:
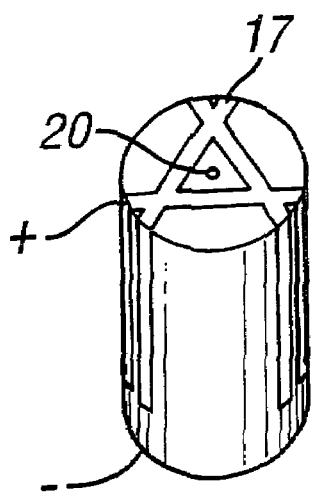
Figure 7D:
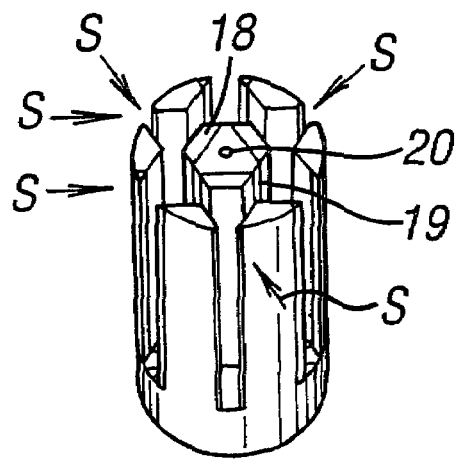
Figure 7E:
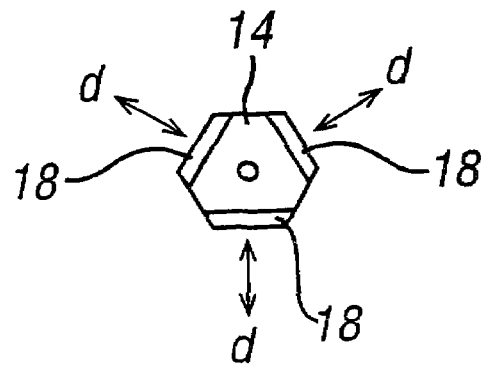
Figure 8:
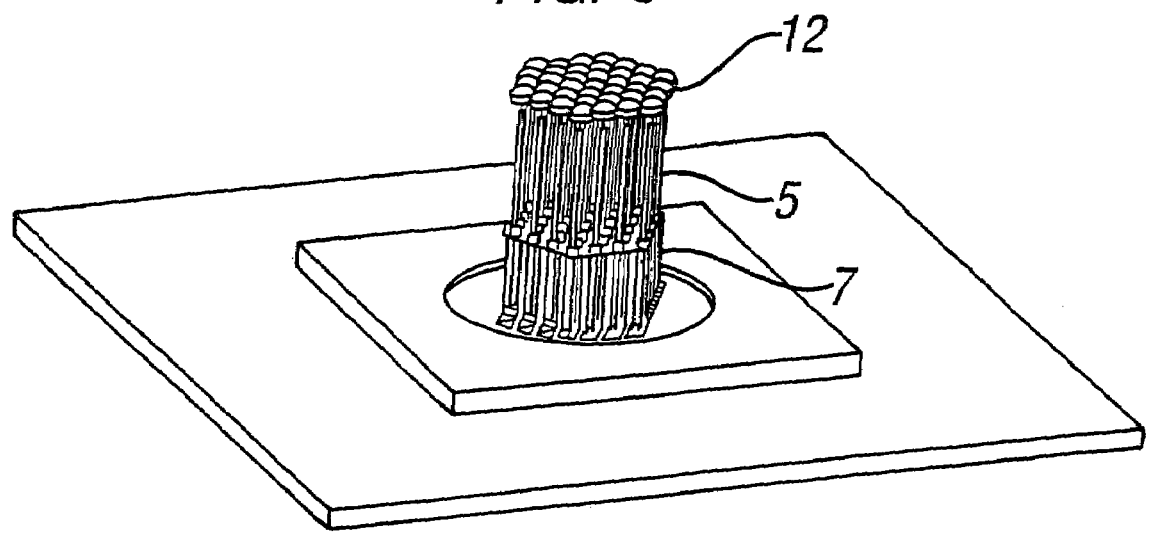
Figure 30:
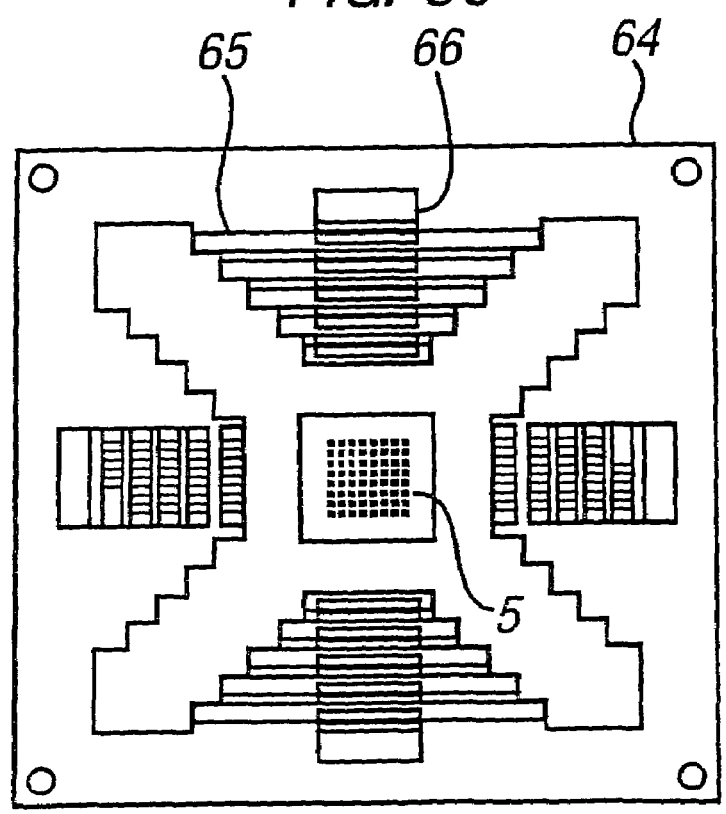
Figure 9:
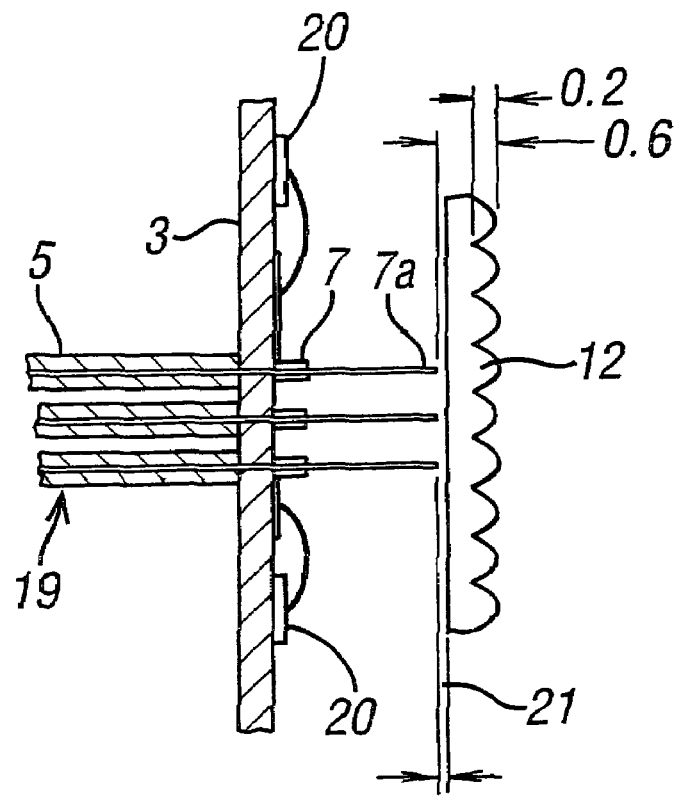
Figure 12:
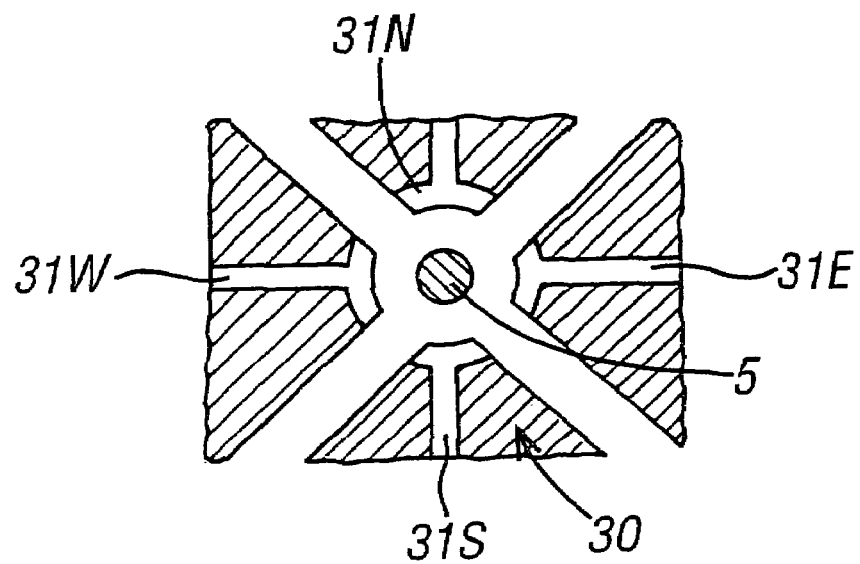
Figure 11A:
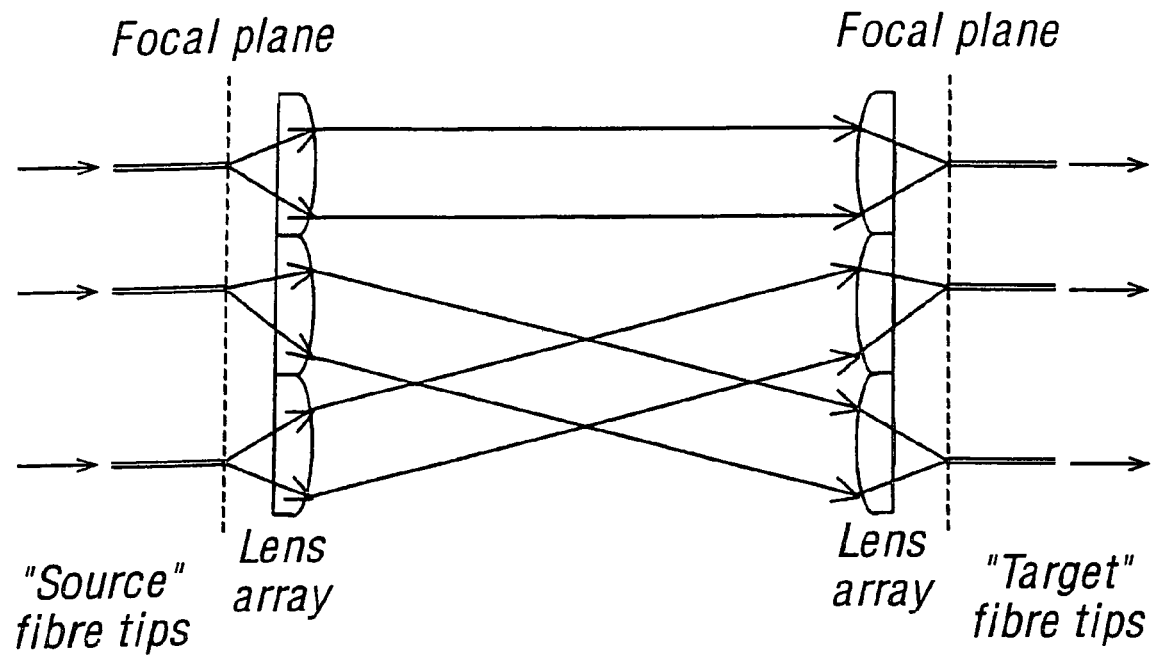
Figure 11B:
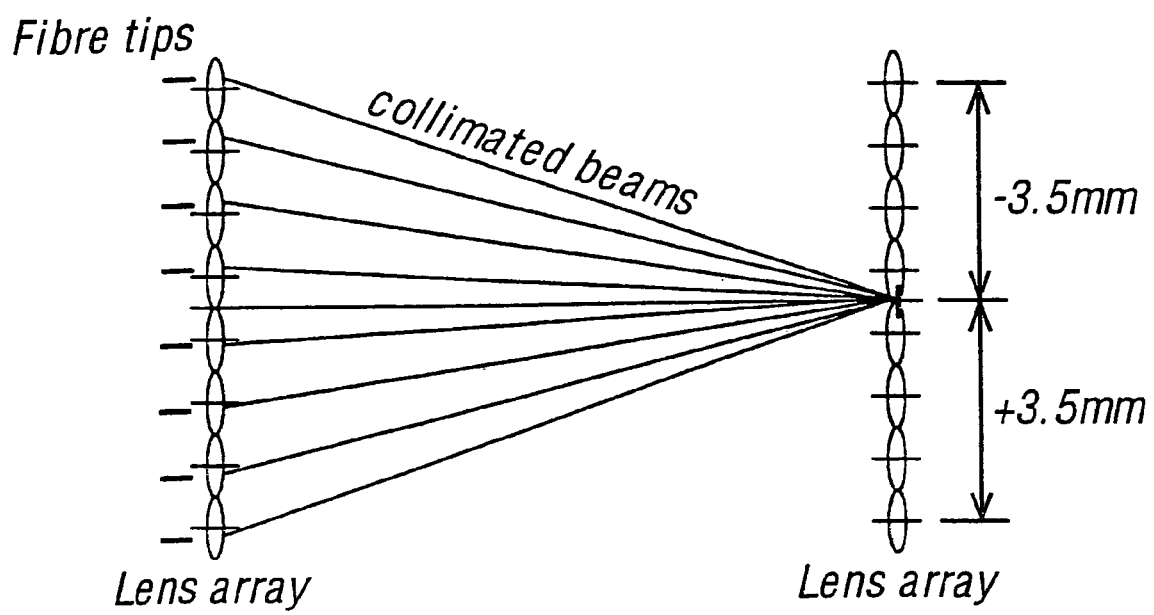
Figure 13A:
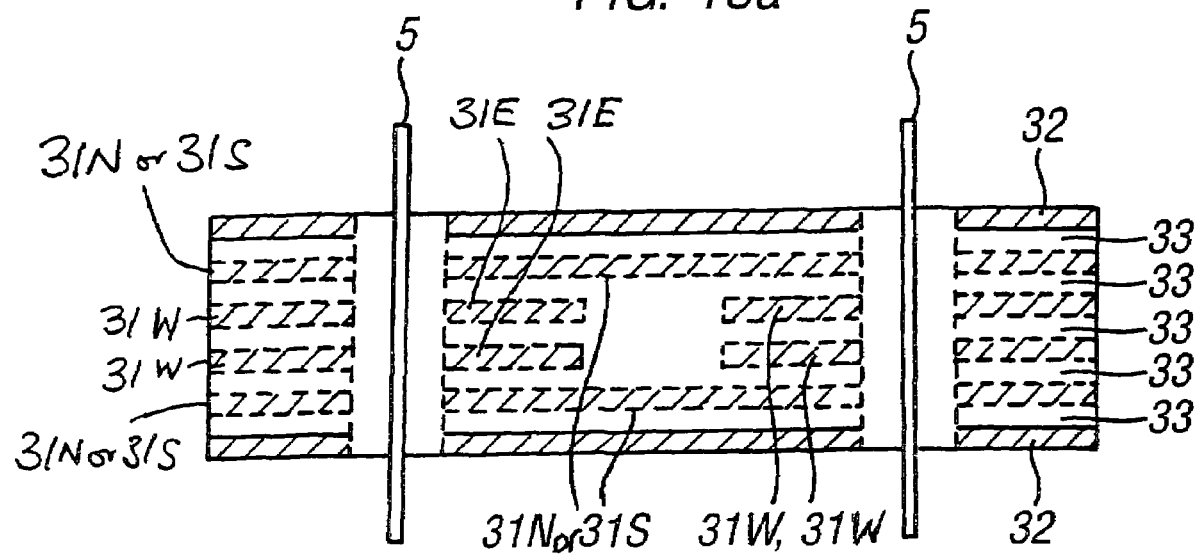
Figure 13B:
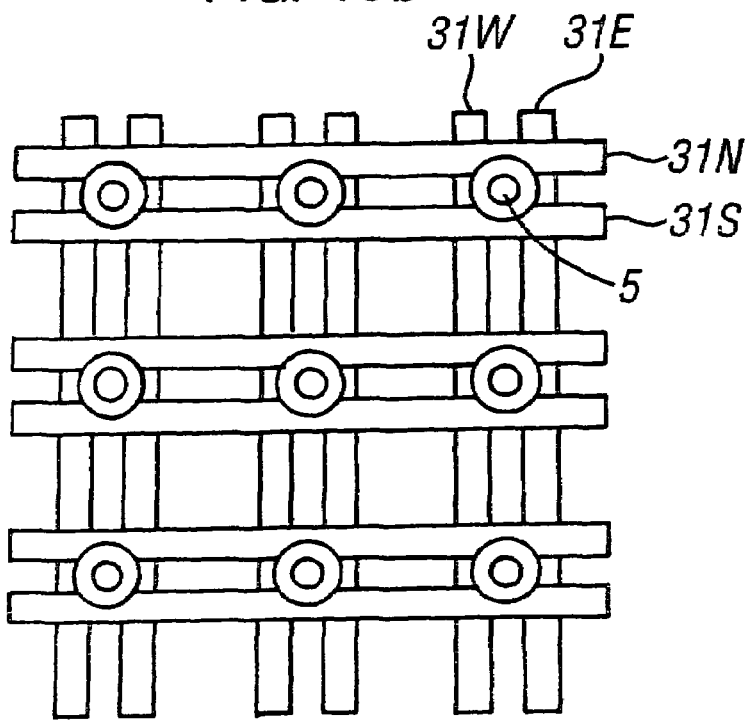
Figure 14:
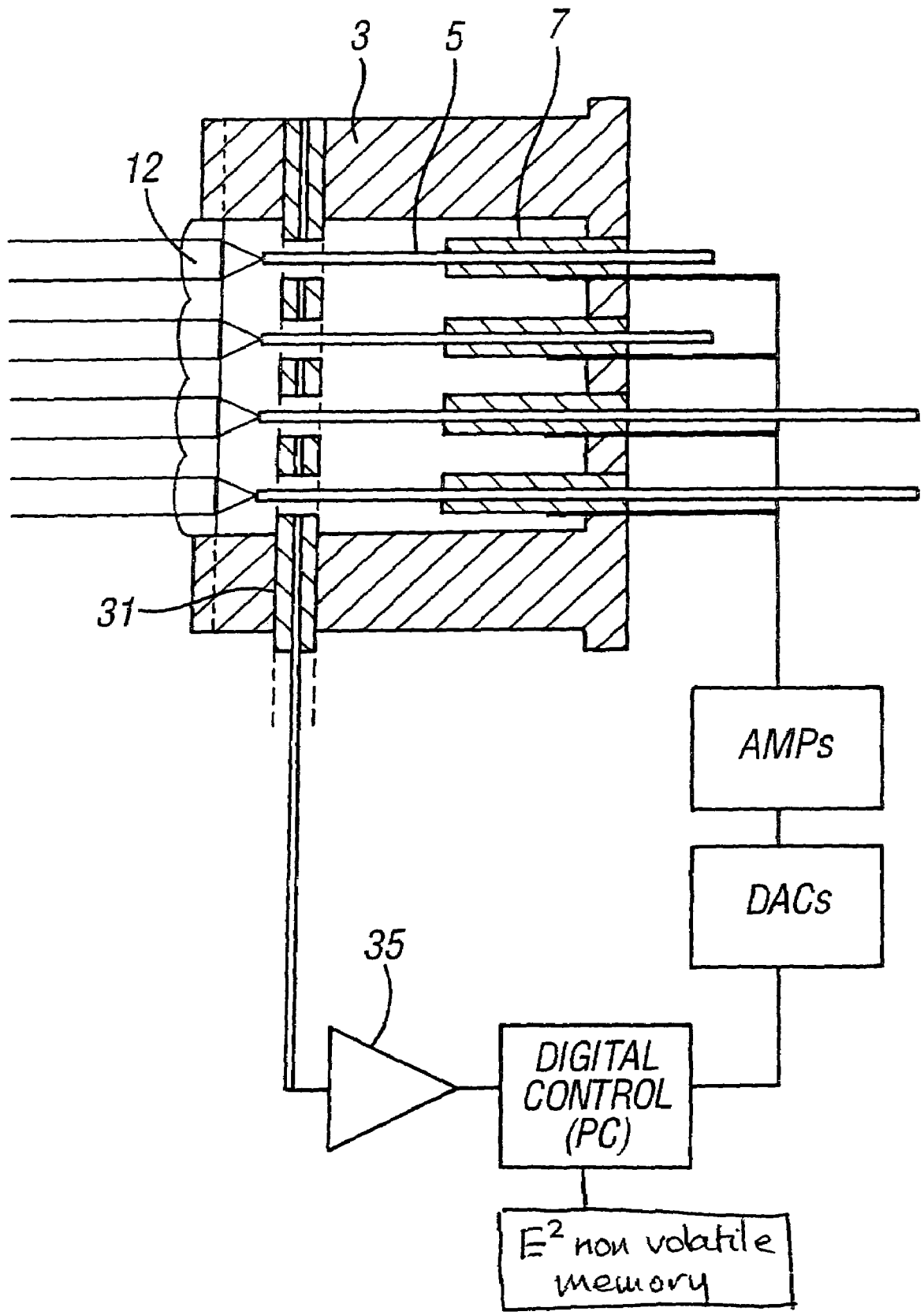
Figure 15:
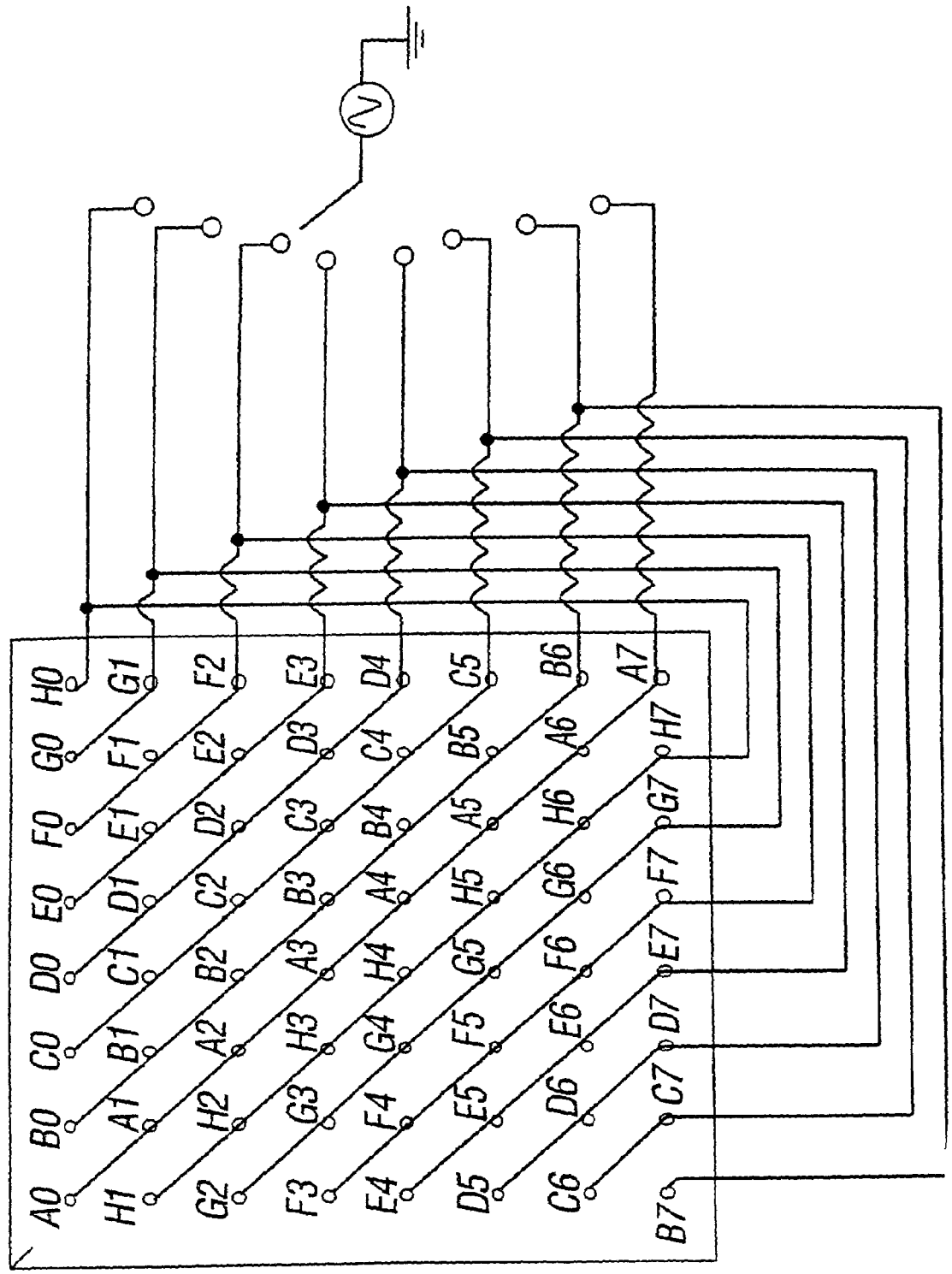
Figure 16A:
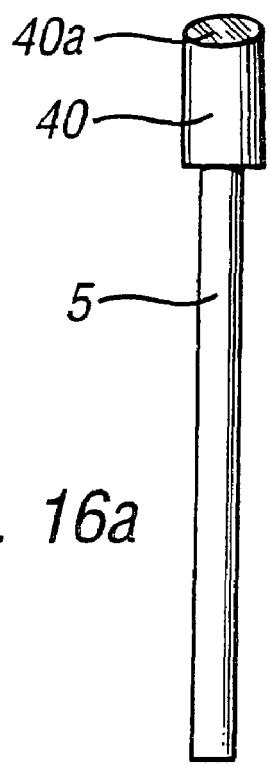
Figure 16B:
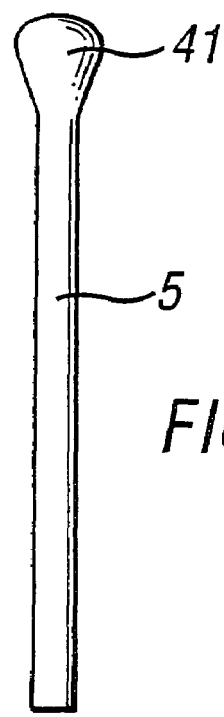
Figure 17:
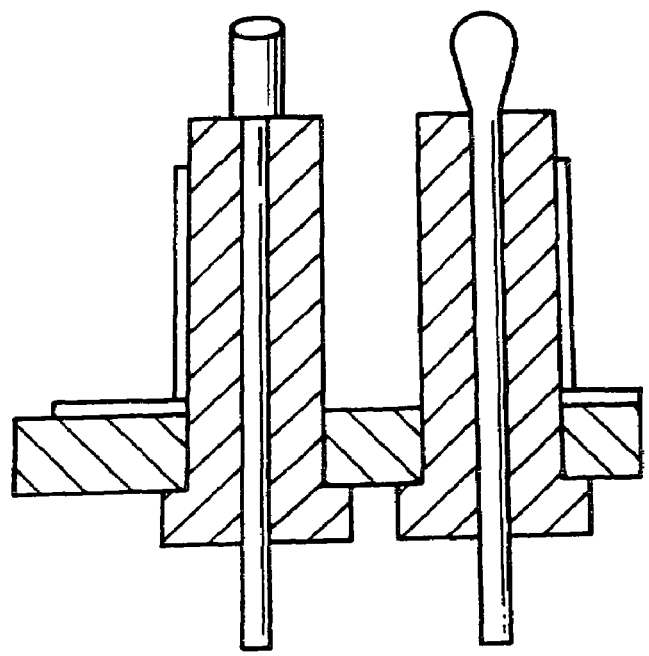
Figure 22:
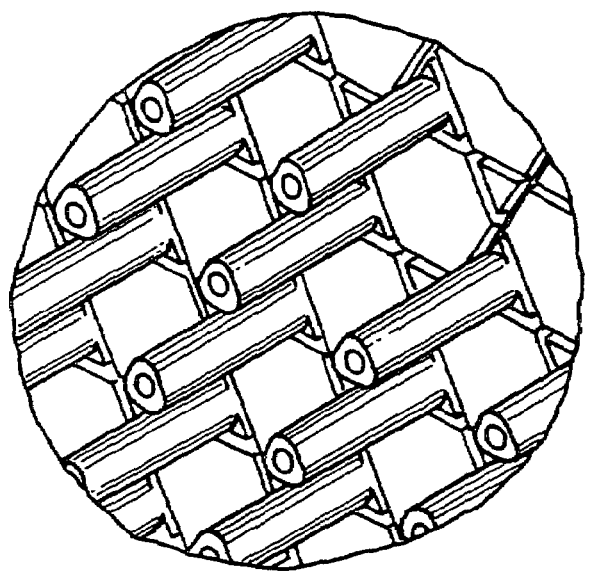
Figure 23A:
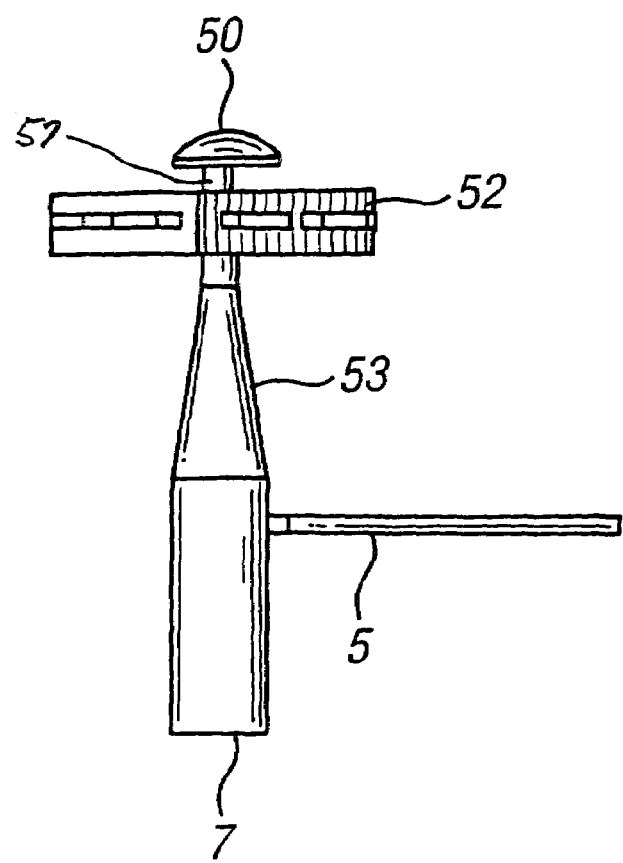
Figure 23B:
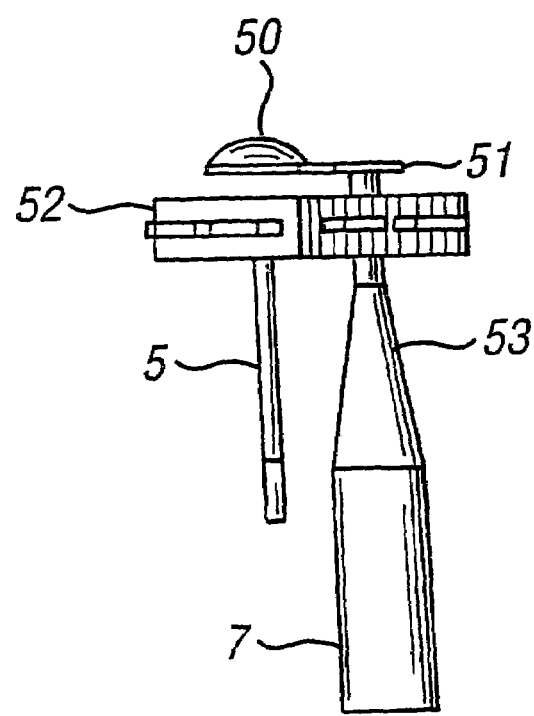
Figure 26A:
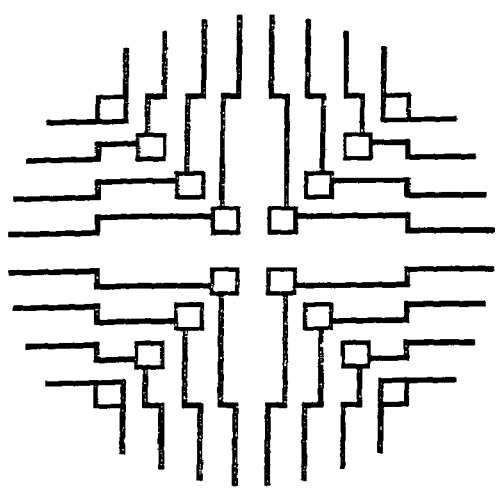
Figure 26B:
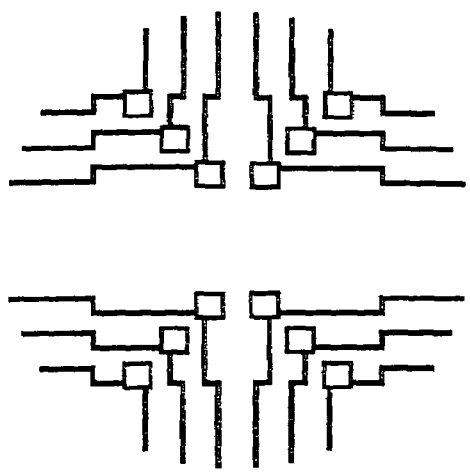
Figure 26C:
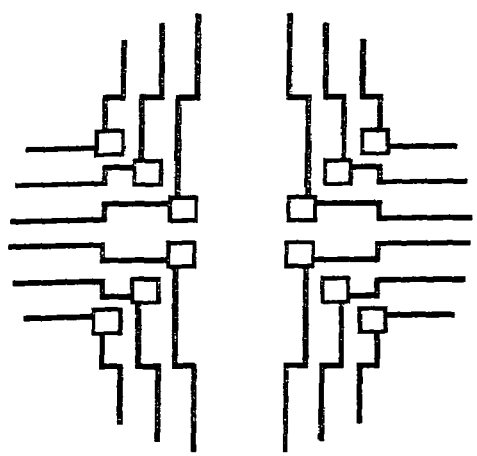
Figure 26D:
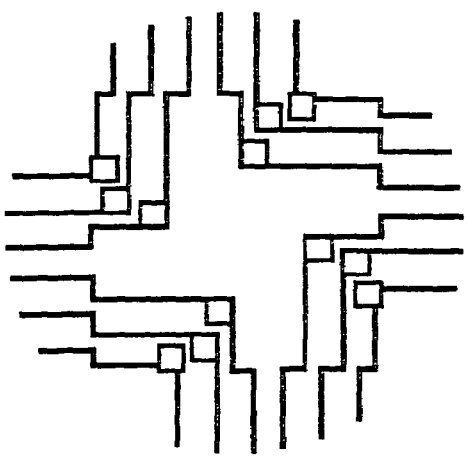
Figure 26E:
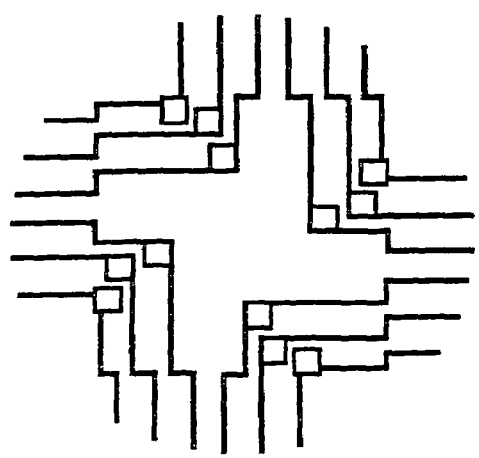
Figure 27A:
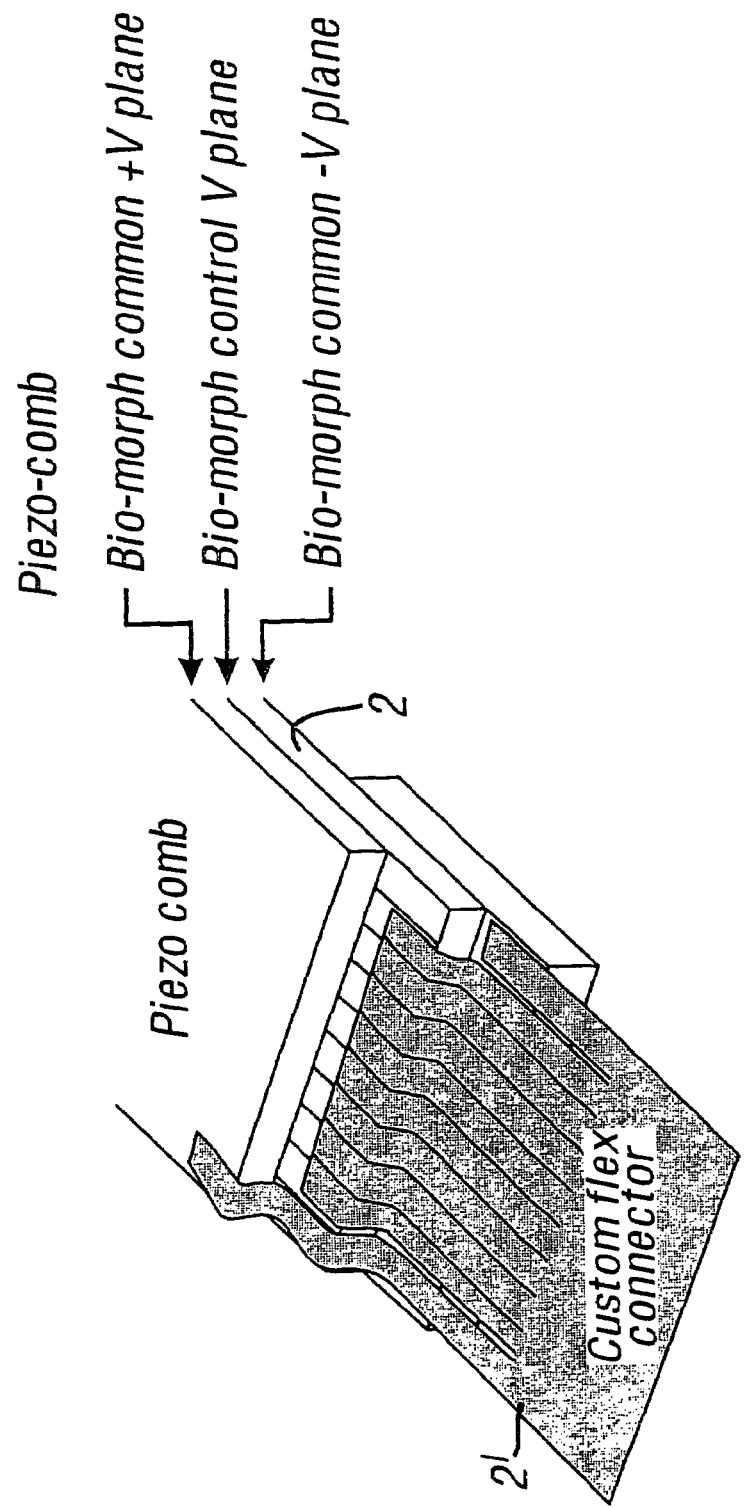
Figure 27B:
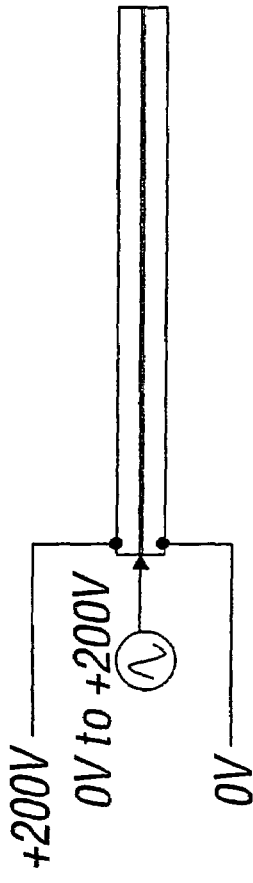
Figure 28A:
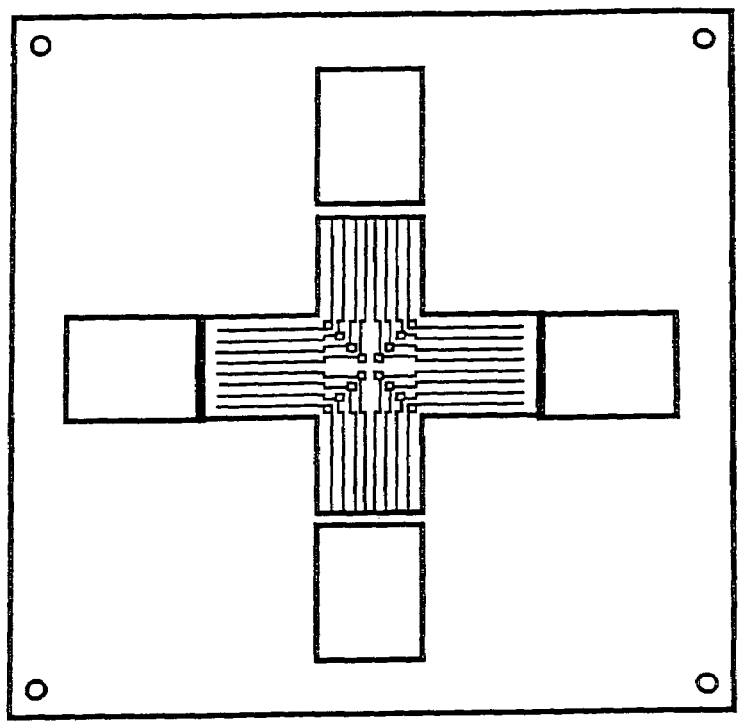
Figure 28B:
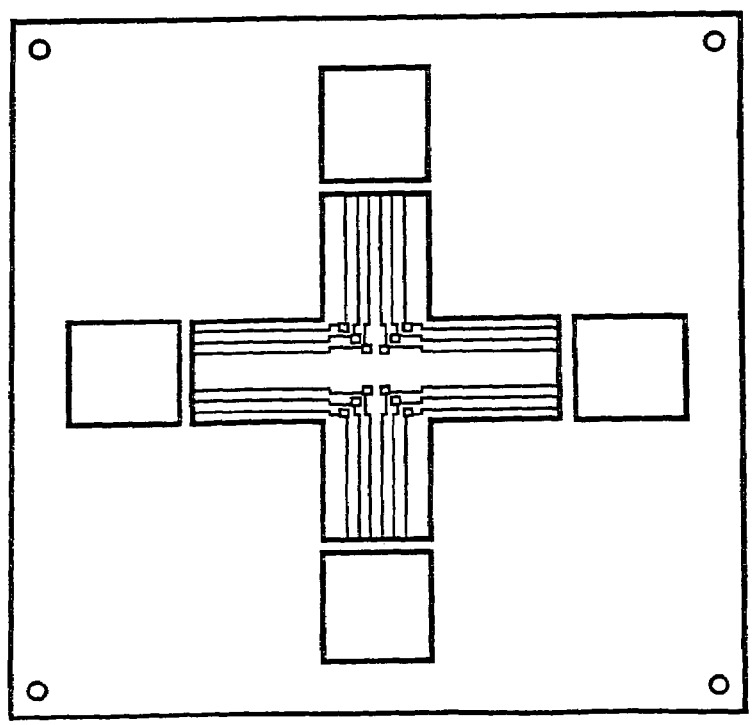
Figure 28C:
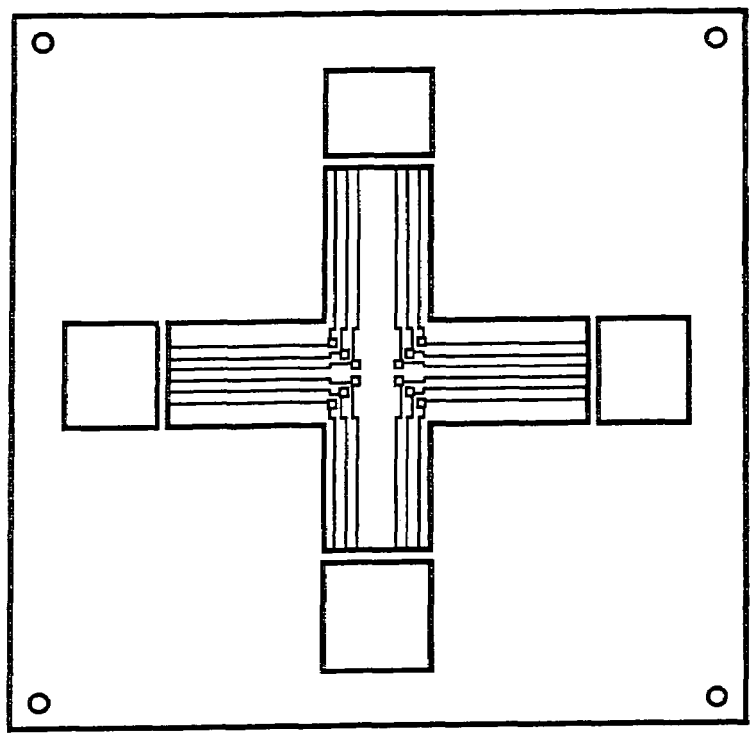
Figure 28D:
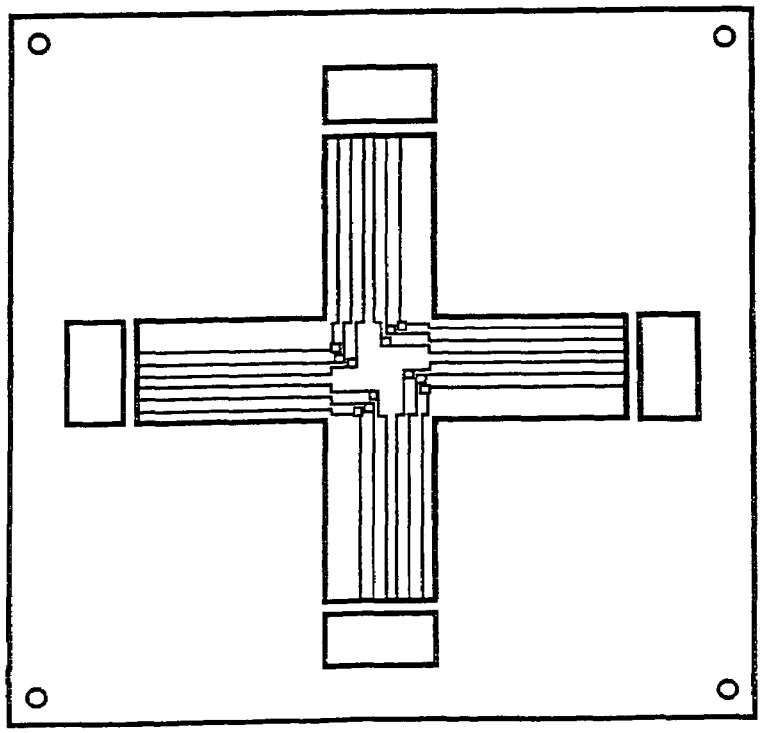
Figure 28E:
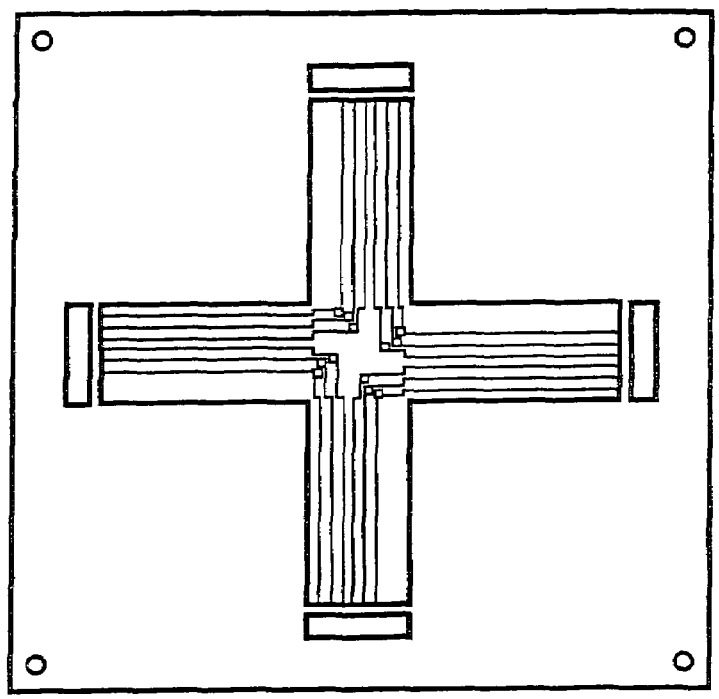
Figure 29:
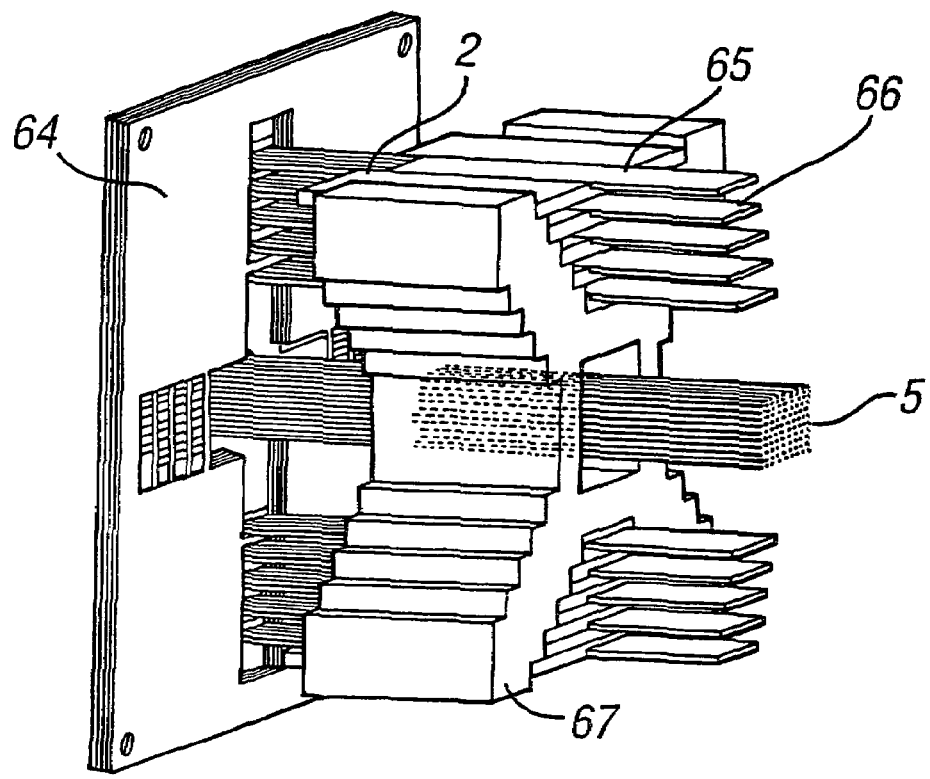
Figure 31A:
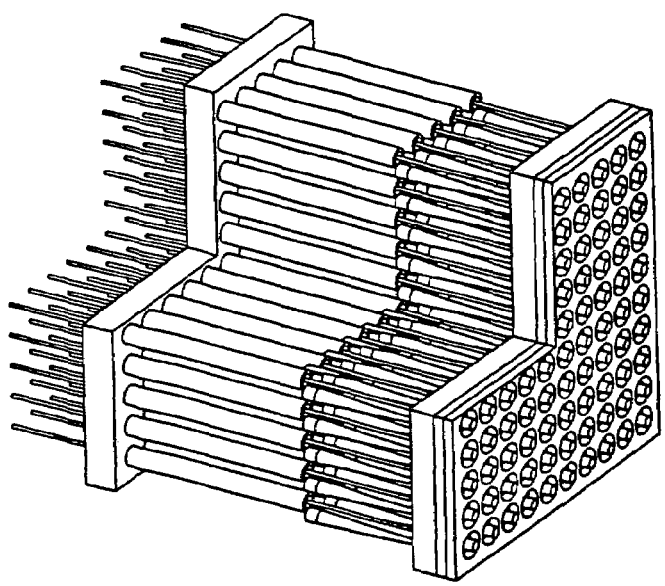
Figure 31B:
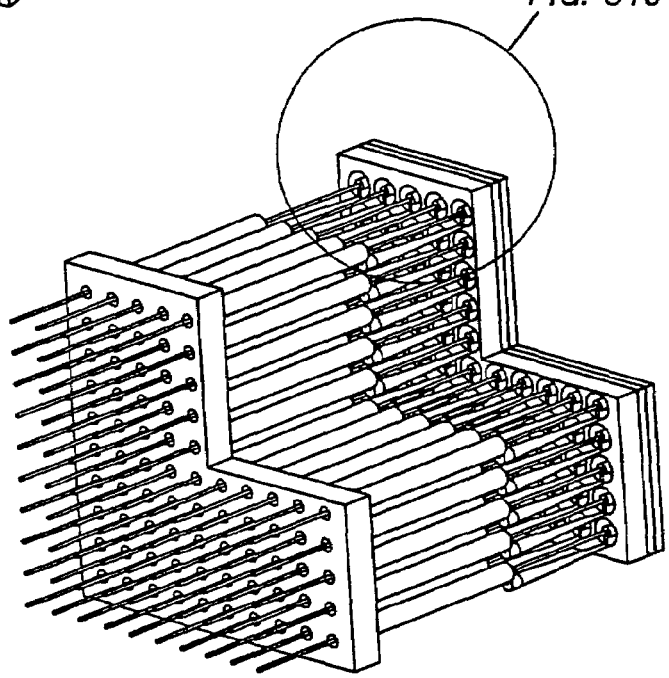
Figure 31C:
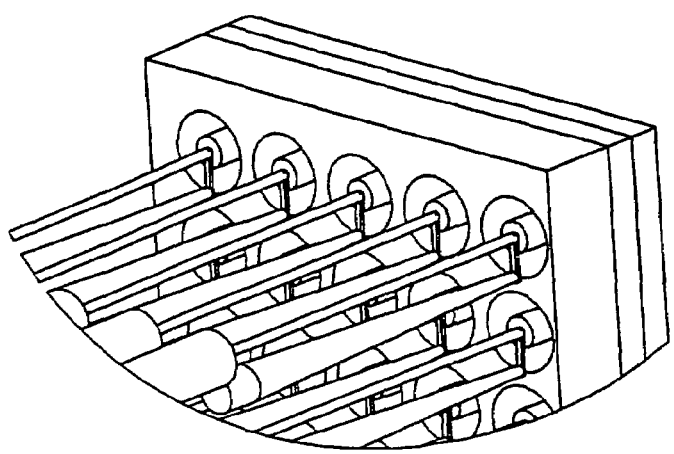
Figure 32:
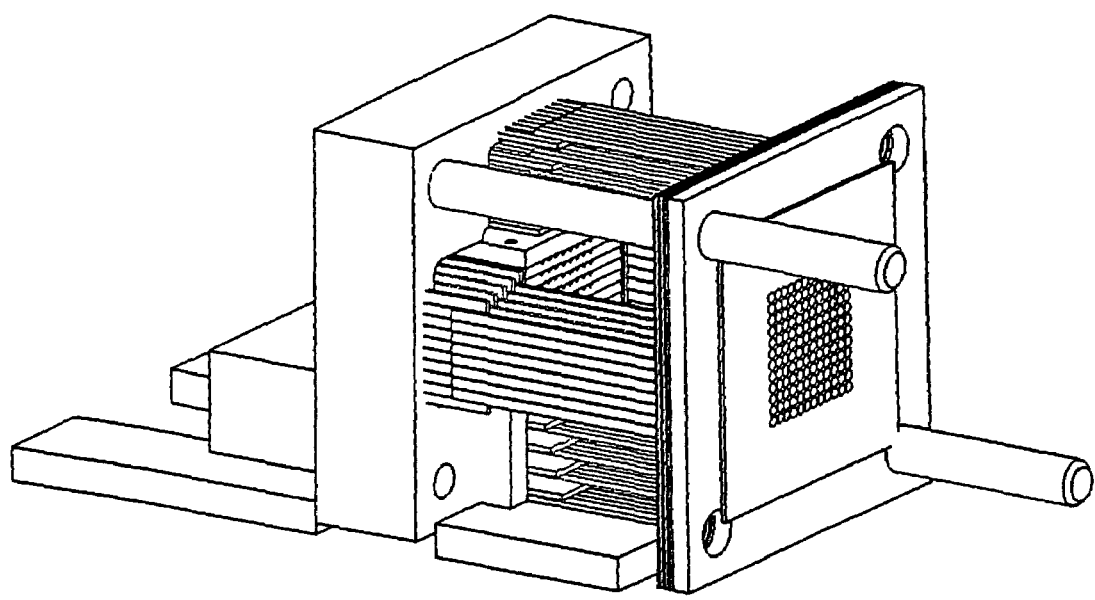
Figure 33:
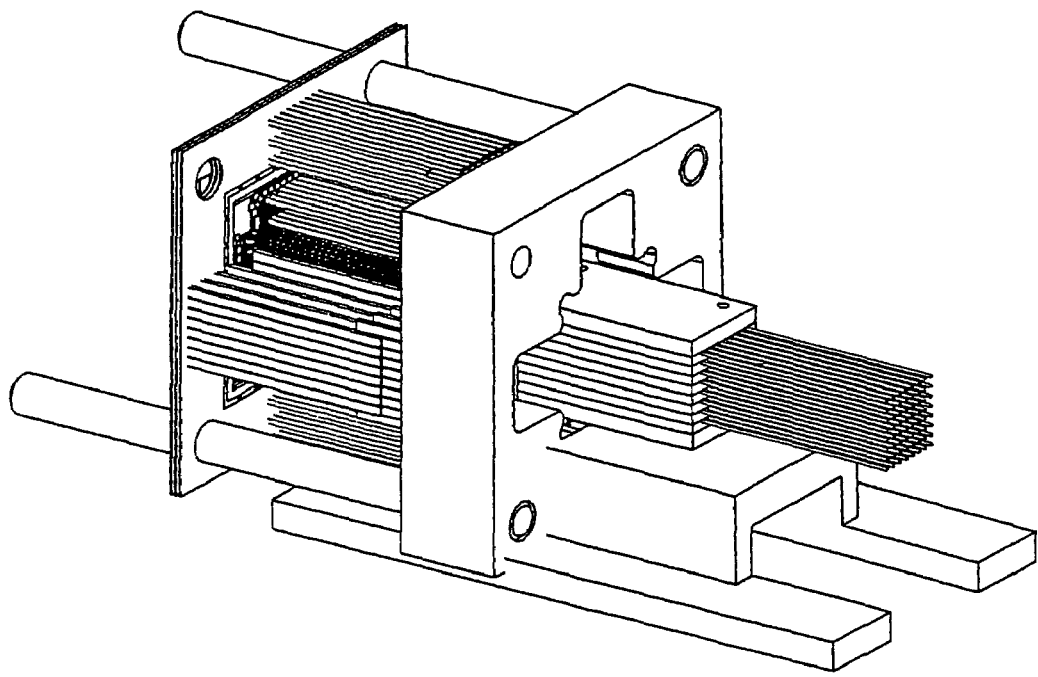

FIGS. 5 and 6 are different perspective views of a 4-port switch assembly, including 4 lenses, showing piezo combs connected to foil strips for moving optical fibres in the focal plane of lenses (only 4 ports are shown to simplify explanation, since multiplicity of ports would be employed in practice);

FIGS. 7a-7d are perspective views showing the stages of manufacture of a monolithic type of actuator and FIG. 7e is a plan view;

FIG. 8 shows a group of monolithic actuators and lenses;

FIG. 9 is a schematic elevation through a monolithic actuator assembly with a lens array (when a hexagonal array of fibres and actuator is used);

FIG. 10 shows the sub-assembly of FIG. 9 used in a reflective type of switching assembly in which radiation is projected through a half-silvered mirror onto a CCD;

FIG. 11 shows the sub-assembly of FIG. 9 used in a pass-through type of switching assembly in which radiation passes directly from transmitter fibres to receiver fibres and FIGS. 11a and 11b are diagrams for further explanation;

FIG. 12 is a schematic cross-section illustrating a capacitive sensing arrangement;

FIGS. 13a-13b show another embodiment of capacitive sensing;

FIG. 14 is a schematic electronic diagram;

FIG. 15 shows a technique of diagonal switching explained in detail below;

FIG. 16 shows fibres with attached and integral collimator lens;

FIG. 17 shows collimator arrangements with monolithic types;

FIG. 18 shows a gimbal mounting for a collimator;

FIG. 19 shows an alternative gimbal mounting;

FIG. 20 shows an exaggerated effect of tilting the gimbal mounting and collimator;

FIG. 21 shows a detail of a foil type connection structure for gimbal and translational mounting of collimators;

FIG. 22 shows an array of piezo tube type actuators on a triangular array;

FIGS. 23a and 23b are side views of an embodiment using a moving lens and a fixed fibre;

FIG. 24 is an isometric view of the latter embodiment using a moving lens and a fixed fibre;

FIG. 25 shows a group of the arrangement of the devices shown in FIG. 24;

FIGS. 26a-26e show an example of each of five different foil designs in plan view for a five-layer 64 port foil type switch assembly;

FIG. 27 is a perspective view of a piezo comb actuator; FIG. 27a shows a detail of the electrical connectors and FIG. 27b shows connection details for the piezo comb actuator of FIG. 27a;

FIGS. 28a-28e show different plan sectional views of each of 5 layers of piezo comb arrays and foil arrangements;

FIG. 29 shows a sub-assembly (foil type) of a switch (including 64 ports);

FIG. 30 shows a rear view of the switching sub-assembly (foil type);

FIGS. 31a-31c are isometric views of a sub-assembly of monolithic type actuators;

FIGS. 32 and 33 each show other switching assemblies; and

Figure 34:
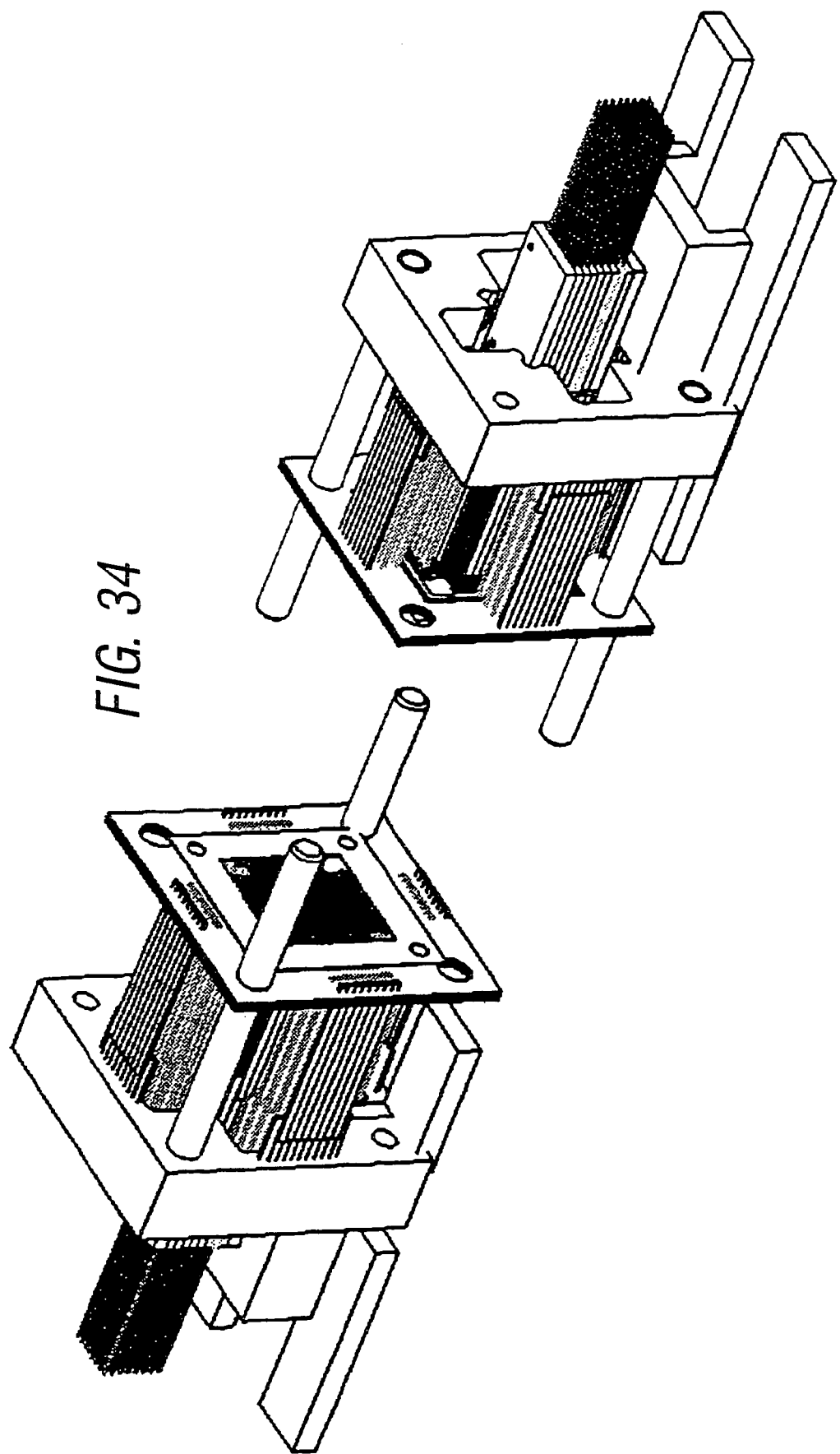

FIG. 34 shows two of the assemblies of FIG. 32 used with spaced transmitter and receiver

DETAILED DESCRIPTION OF THE FIGURES

Figure 1:
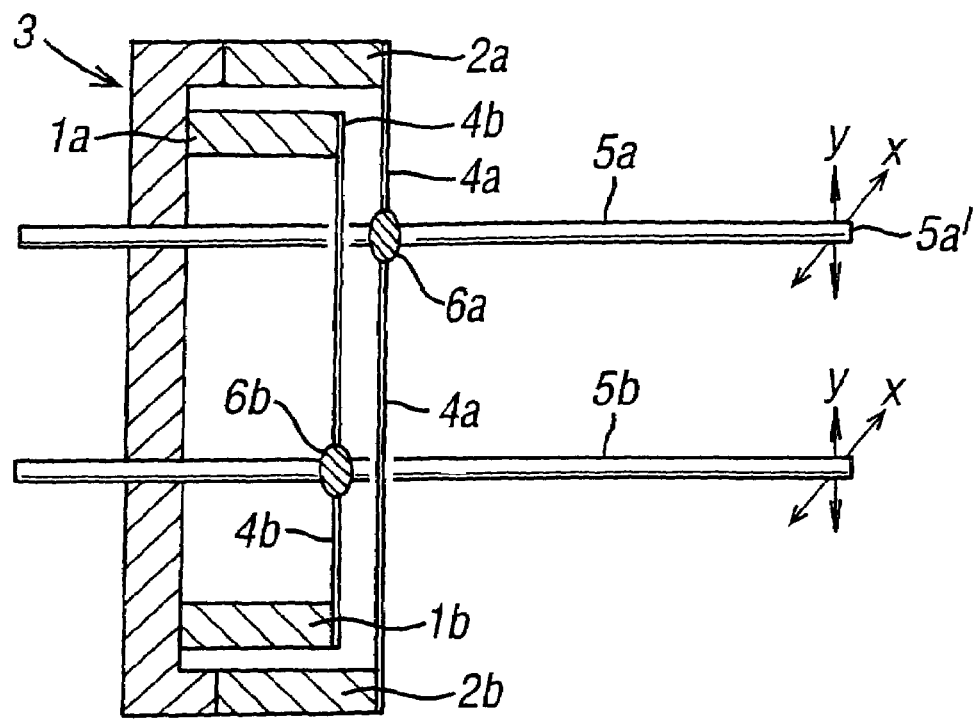
FIG. 1 is a schematic cross-section through one embodiment of a foil type of device for moving optical fibres.

FIG. 1 schematically illustrates 'foil type' devices which can be used, for example, for moving optical fibres. In each device, piezoelectric transducer elements 1a, 1b; 2a, 2b form respective sets of fingers of a comb structure fixed at one end to a support unit 3. The ends of the fingers are fixed to respective foils 4a, 4b, with pairs of comb-like structures located on opposite sides of respective fibres 5a, 5b. Each fibre, such as fibre 5a, is fixed to respective foil sets 4a by a bead of adhesive 6a or solder contacts if the fibre is metallised. The piezo electric material transducer elements 1a, 1b; 2a, 2b bend (in parallel) in the same direction so as to impart 'push/pull' movement to the respective fibre (in one of two orthogonal directions). Other piezo electric material transducer elements (not shown and which are arranged perpendicularly to the former elements) bend similarly (but in a different orthogonal direction so as to impart 'push/pull' movement to the respective fibre). The resultant provided the fibre with two degrees of motion in orthogonal directions. Accordingly, radiation passing through the fibre 5a and leaving from the end 5a' can be deflected anywhere in an x-y plane. The 'radiation' can be laser light, or light from an LED, for example, but it can also be other forms of electromagnetic energy.

Figure 2:
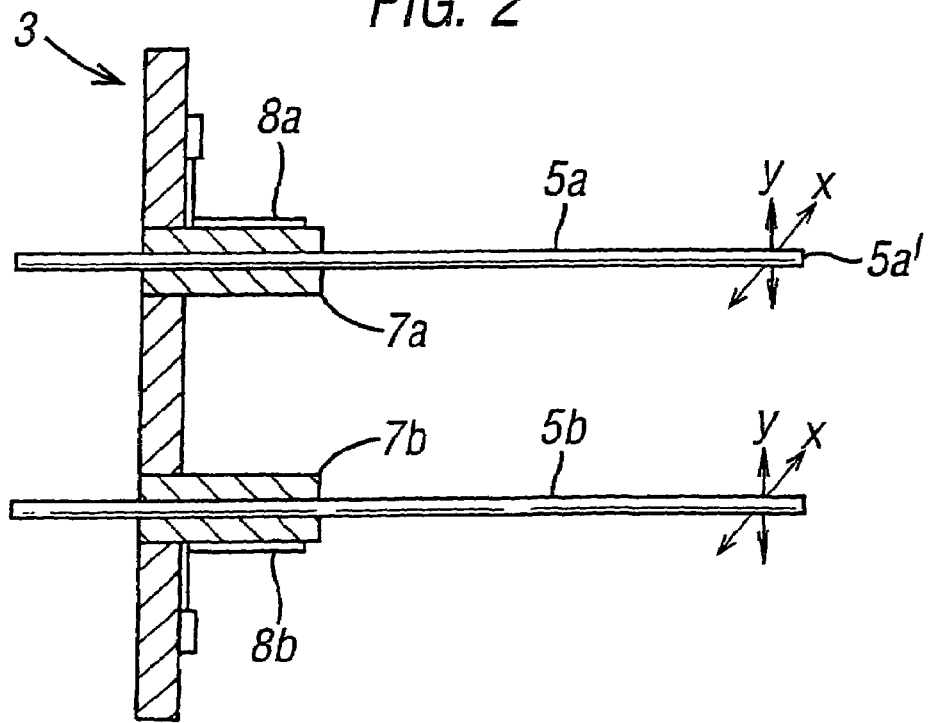
FIG. 2 is a similar cross-section through a monolithic type.

FIG. 2 schematically illustrates a 'monolithic type', where each of the piezo elements 7a, 7b has a cylindrical or rod-shaped body with a central bore along its longitudinal axis in which the optic fibre 5a, 5b is received. One end of each piezo element 7a, 7b is firmly secured to support unit 3, and the free end is free to move as a result of bending the body with respect to the longitudinal axis (as explained below). The drawing also shows electrical interconnects 8a, 8b to the piezo elements. As with the foil type, radiation leaving the end 5a' is deflected by bending the fibre 5a in the x-y plane.

Figure 3:
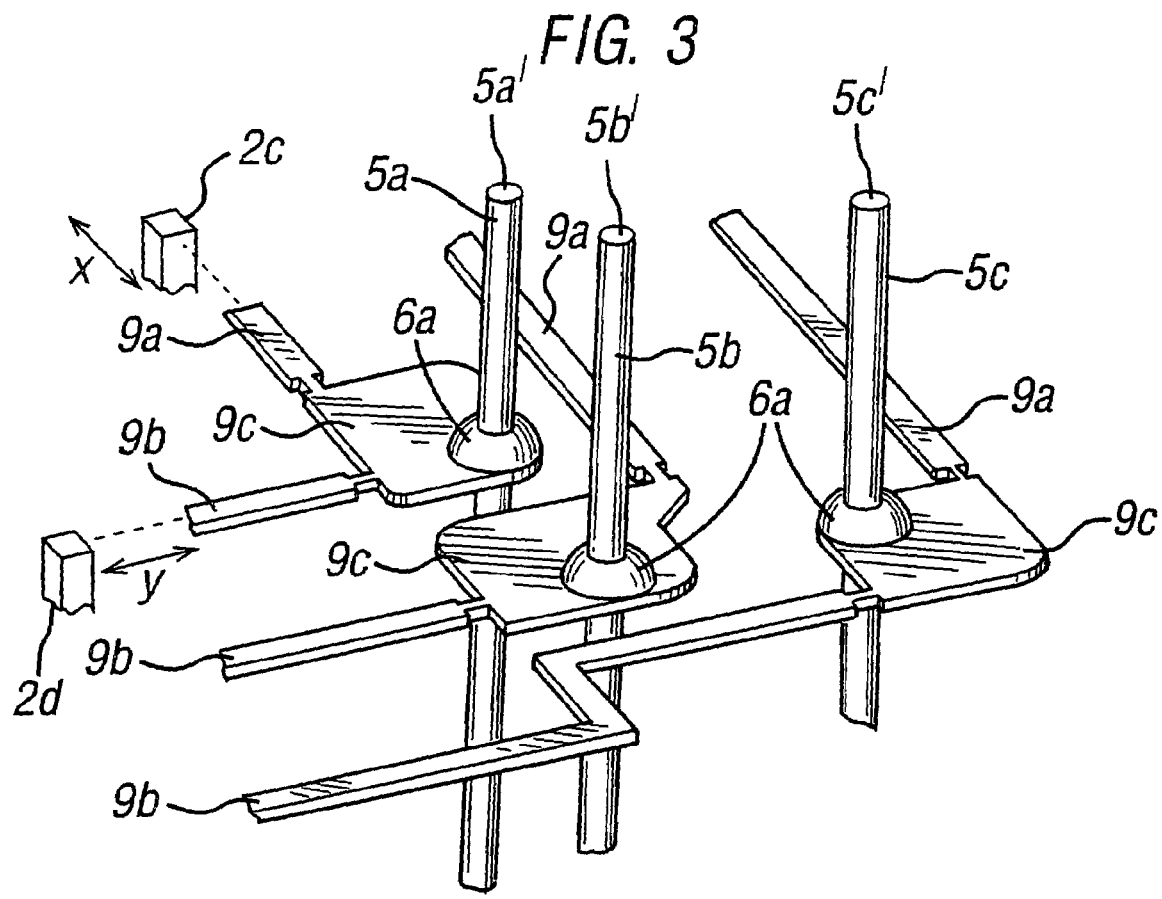
FIG. 3 is a perspective view showing foil actuating strips (driven by piezo electric material actuators) supporting fibre optics.

FIG. 3 shows an enlargement of a modified 'foil type' in more detail. In this case each foil is in the form of strips, such as 9a, 9b extending perpendicularly to each other and terminating at one end in a pad 9c through which fibre 5a passes and is secured by the adhesive bead 6a or solder contact if the fibre is metallised. FIG. 3 illustrates three different arrangements, i.e. where the strips 9a, 9b join the pad 9c at different locations (and in one case where strip 9b is formed through two right angles before being joined to the pad. The other ends of the strips are attached to the fingers 2c, 2d of a comb-like structure of piezo electric material. These fingers impart motion in each of two respective orthogonal directions x-y (as shown) to the foil strips, whereby the end portion of the respective fibre 5a moves in these directions, so that light emerging from the end faces 5a', 5b', 5c' is deflected.

Figure 4:
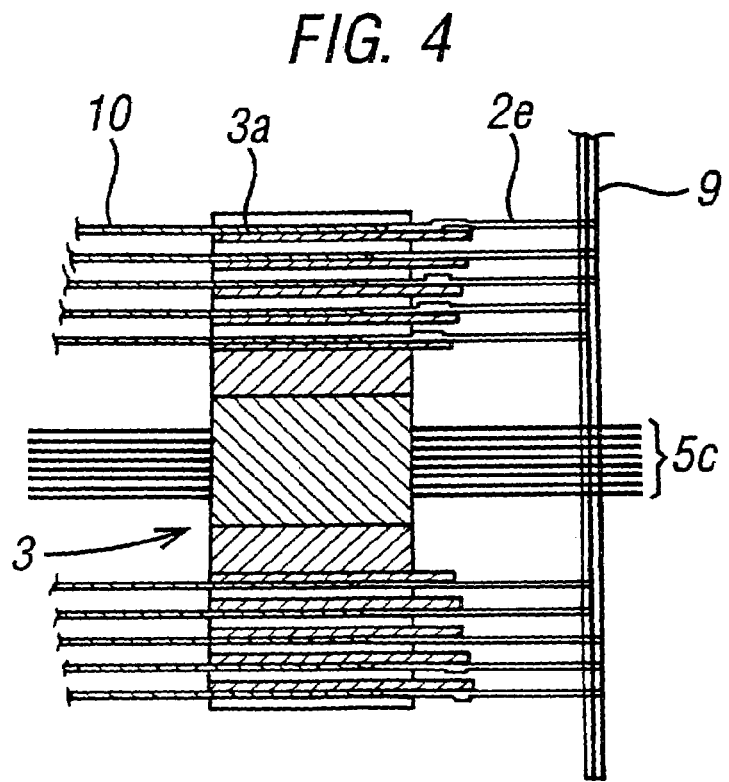
FIG. 4 is an elevational cross-section through a foil type sub-assembly.

FIG. 4 is a cross-section, in elevation (rotated through 90°), showing a set of optical fibres 5 passing through support structure 3, each fibre being secured to respective foils 9, arranged in separated layers, in a foil stack (not shown in detail). Each of the foils is connected to respective fingers of a piezoelectric comb structure 2e, which is mounted in a support plate assembly 3a in the support structure. Ribbon cable 10 is connected to the piezo actuators to provide energisation.

FIGS. 5 and 6 illustrate, more graphically, how the piezo electric material comb structures 2e are connected to the foil structures 9, which are attached to respective optic fibres 5, whereby the ends of the optic fibres are caused to move in the focal plane of respective lenses 12. FIGS. 5 and 6 show schematically a 4 port structure having only four lenses, in order to simplify the drawing and explanation. The assembly can, of course, have 'n' lens elements for 'n' fibres in an 'n' port switch, where 'n' is the number of ports required in the particular application. The lenses 12 are supported in a block 13 which also supports capacitive position sensors (as explained below).

FIG. 7 shows four stages 7a-7d during the manufacture of a 'monolithic type' of piezo electric material transducer. The first stage 7a illustrates a body 7 of piezo electric material having a generally cylindrical shape. The second stage shows pairs of V-shaped saw cuts, V1, V2, V3, which form grooves defining a central pillar 14 of triangular cross-section segments 15a, 15b, 15c and peripheral thin pillars 16a, 16b, 16c each of triangular cross-section. These grooves are then filled with a low-melting point alloy 17 in stage 7c. Finally, further saw cuts S are made as shown in FIG. 7d in order to define three interconnects in the form of isolated conductive pads 18 on the triangular sides of the central pillar 14. These pads are isolated along the length of each side edge due to the gap 19 (of piezo electric material) which is opened up by the respective saw cut S. Electrical inputs to each of these pads cause the central pillar 14 to bend and to flex the fibre optic. The plan view of FIG. 7e shows the individual motion 'd' imparted by each pad 18 when energised. By suitable energization of these pads, a resultant motion can be achieved for moving the pillar 14 in the x-y axes. A through hole 20 bored in the body of piezo electric material, along the longitudinal axis, receives the optic fibre as shown in the schematic diagram of FIG. 2.

A similar structure can be made by (a) moulding the pillar 14 of piezoelectric material prior to firing and (b) attaching the pads 18 by coating. Such a pillar could be hollow or solid and of different cross-sectional shapes.

FIG. 8 is a perspective view of a group of monolithic type transducers 7. Each of these transducers supports a respective optic fibre 5, the terminal end of which moves in a focal plane of the respective lens 12. This shows the fibre array in a hexagonal/triangular arrangement, but square arrays can also be used.

FIG. 9 is a cross-section through three monolithic transducers 7, each mounted on a base board 3 which supports optic fibres 5. These are shown as having cladding 19 on the left hand side of the board 3 and as fibres extending through transducers 7 which terminate in ends 7a close to each collimating piano-convex lens 12 of a lens array. A bi-convex lens array can also be used. This separation is indicated by the gap 21 which is arranged so that light emerging from the end of each fibre is at the focal plane of the respective lens. Connectors 20 having bond wires connected to transducers 7 are also shown.

FIG. 10 is a schematic view of an assembly used in calibration during setting up. It shows beams of light 22 output from each of the lenses 12 which first pass through (eg.) a partially reflective mirror (eg. dielectric multilayer stack or half silvered) 29, which partially transmits beams to a CCD device 23 and partially reflects the beams. The position of the straight through beams on the surface of the CCD 23 can be related to the absence (or presence) of signals used to energise the piezoelectric transducers. Likewise, the position of a deflected beam from a transmitter fibre, which is partially reflected by the mirror 29 onto a receiver fibre (in the same stack), as well as partially incident on the surface of the CCD 23, can be related to instantaneous signals used to energise the piezoelectric transducers to cause different deflections. This enables the transducer drive signals to be derived for correctly aiming and steering the end portions of the fibres so that the output beams arrive at their correct destinations (i.e. the selected receiving fibres in the working switch). For example, lookup tables can be used to remember the ideal fibre-tip positions at each end in order to create required fibre-to-fibre couplings (i.e. cross-connections between transmitter and receiver ports. This enables operation of the assembly as a switch and the assembly would be made reversible (i.e. the transmitter fibres can be the receiver fibres and vice versa)).

FIG. 11 shows a different arrangement which can be similarly calibrated but also use in operation and where the beams of light 22 leaving the transmitting collimating lens assembly 12t are received by a receiving lens assembly 12r, which focuses the light on respective optic fibres 5 in a (similar) monolithic structure. The energising signals can be similarly calibrated with regard to beams of light passing straight through and being deflected since the transmitting beams will be received by respectively different fibres. This arrangement is fully 'reversible' since the 'transmitter's can be the 'receivers' and vice versa.

Referring to FIG. 11a, it is to be noted that:

i. Each fibre in the switch is associated with a small collimating lens ii. Fibre tips are placed in the focal plane of each lens iii. A collimated Gaussian beam will be produced if a fibre is lit since light will emerge from the fibre tip in the focal plane and be collected and collimated by the lens iv. Movement of each fibre-tip within the focal plane results in an effective angular swing of the collimated beam v. By symmetry, any collimated beams which arrive at a target lens will focus to a point in the focal plane of the target lens vi. If a fibre-tip were placed at the point defined in (v) then light will be coupled into the fibre A combination of (iii) and (vi) permits fibre to fibre coupling. Light from one fibre can be transformed into a directional collimated beam by (iii). By moving a lit fibre-tip (the 'source') it can be arrange that the collimated beam from its associated lens is directed as the lens associated with a totally different fibre (the 'target'). By moving the target fibre it can be arranged that light from the incoming collimated beam may be collected and thus a fibre-to-fibre coupling condition has been set up. Since the optical system is symmetrical, the terms 'source' and 'target' fibre-tips can be used interchangeably and in a coupled scenario light can be transmitted in either direction.

Calibration would be carried out using the following steps:

1. Each fibre is ground in 2D and for each fibre the capacitance values for retro reflection are located.

2. Sequentially each fibre is moved to the positions on the CCD, using the retro reflection to calibrate the reference points.

3. For each fibre to each fibre the 2x and 2y average voltages are optimised for maximum coupling.

4. With 128 fibres (64 at each end) we have 64 x/y capacitance values stored, i.e. 16,384 numbers. These are stored in the non-volatile memory of the switch and used as the target capacitance values for the desired switch settings.

These steps refer to either the reflective or other straight-through design.

Referring to FIG. 11b, there exists an optimum rest position of fibre-tips which confers important system benefits (including optimum coupling efficiency).

With no effective deflection (i.e. no applied voltage on the piezo actuators), the collimated beam from each fibre tip should ideally aim towards the centre of the target lens array (or, by reflection, to the centre of the source array in a folded system). The aim of this is to minimise the bipolar fibre-tip translation required from the rest position to approximately one half of the array size.

Fibre tip Z positions must be within the depth of focus of the lens array to ensure high quality collimated beams. All fibre tips must be within a range behind the back surface of the lens array glass substrate, defined by the focal length of the lens array.

The angle of fibres relative to the lens array should be ideally 90°. Any significant deviation from a perpendicular geometry may have a detrimental effect on coupling efficiency and limit scalability.

In order to sense the position of each individual optical fibre, foil type or monolithic type (for correlating deflection with transducer drive signals), capacitive coupling is employed between (eg) each moving end portion of the fibre optic (which is coated with conducting material to form a moving plate), and other relatively fixed plates. An array of such coated fibre optics can be aligned inside a similar array of capacitive sensor pickup units. The array may be either square or hexagonal to ensure optimum packing density. Array sizes are scalable to larger number of fibres (>1000) suitable for future high port count optical cross connects for fibre optic communication applications.

The position of the optical fibre is determined by a measure of the capacitive coupling between the fibre and capacitive sensor plates. As capacitive feedback determines the fibre optic position with respect to the lens array 12, the capacitive feedback mounting unit is rigidly connected to the lens array to ensure precise reference to the fibres of the lens centres. (An alternative embodiment uses fixed fibres and a moving lens). The capacitive sensor plate pickup units can be formed either as shown in FIG. 12 or in FIGS. 13a and 13b.

FIG. 12 shows, in plan view, one method, where the sensor pickup unit formed from through-hole plated holes in an insulating board material 30. The insulating board material may be printed circuit board or some alternative insulating material such as ceramic. The sensor holes are segmented into four isolated quadrants designed 'North', 'South', 'East' and 'West' (N, S, E & W). Electrical contact is made to these with appropriate patterned electrical tracks 31N, 31S, 31W, 31E. Each (coated) optical fibre passes down the centre of the sensor hole.

FIGS. 13a and 13b show, in sectional view, an alternative arrangement in which the N, S, E and W capacitive sensor plates are formed by perpendicular arrays of parallel conductive tracks 31N, 31S, 31E, 31W intersecting an array of holes through which the optical fibres 5 pass. The capacitive sensor tracks for NS and EW detection are arranged in parallel arrays, the two parallel arrays being perpendicular to each other. For isolation, the NS & EW sensor arrays are isolated from each other by sandwich layers of insulating matrix material 33. Ground plane layers 32 above and below each sensor layers act as a screen against environmental electromagnetic pickup. Note that FIGS. 13a and 13b show only two layers of NS and EW sensor tracks. Improved capacitive feedback sensitivity may be achieved by increasing the number of sensor tracks (layers).

The arrangement of FIG. 12 results in a larger capacitive coupling between the fibre 5 and the sensor plates, whereas that of FIGS. 13a and 13b is inherently easier to manufacture (but to achieve sufficient capacitive coupling between the NS and EW sensor tracks, a vertical array of such tracks are required).

An ac voltage is applied to the conductive coating on each optical fibre, typically at audio frequency. The resultant ac voltage coupled to the sensor plates is then detected using an appropriate low noise amplifier circuit, such as that shown in FIG. 14 (where similar components are identified by similar reference numerals). The ac voltage generated on the sensor plates is proportional to the capacitive coupling between the sensor plate and the fibre conductive coating. This depends on the local distance of the fibre to the sensor plate. Combining information from 31N, 31S, 31E and 31W plates therefore gives information on the localised position of the fibre.

Increased positional accuracy is achieved by coupling the detected voltages on the N and S sensor plates to the two inputs of a differential low noise amplifier 35. Thus as the optical fibre moves closer to the N plate, the N plate detected signal increases, similarly the detected signal on the S plate decreases. The differential is applied to the amplifier. A similar arrangement is used for the E-W plates.

To enable the unique positions of individual fibres within large arrays of optical fibres to be detected, an AC signal needs to be applied to each fibre. Such an arrangement is not practicable with large numbers of fibres. We therefore prefer to use a method by which the unique positions of arrays of fibres may be detected by selectively switching between diagonal rows of such fibres. Details are shown in FIG. 15. By sequentially applying AC to the diagonal rows and by sequentially reading capacitive feedback signals from horizontal rows and columns unique addressing can be achieved. This will now be described in more detail below. (This diagonal switching can be used independently, i.e. in other switching assemblies).

An AC excitation signal is applied to diagonal arrays of fibres (as shown in FIG. 15). For a 64 fibre switch array, there are 15 such diagonals, but by using a vertical and horizontal array of capacitive feedback sensor tracks, arranged orthogonally, the number of addressable diagonals is reduced to just 8. This is explained with reference to FIG. 15, which shows a 64 element array, but the following analysis is applicable to any scalable array. In FIG. 15, the diagonals are A, B, C, D, E, F, G and H. Horizontal rows 0, 1, 2, 3, 4, 5, 6 and 7 such that, for example, the third fibre down from the top and the fifth from the left is designated C2.

Diagonal array A utilises all 8 fibres along the diagonal. However, diagonal array B utilises 7 such fibres (B0 and B6), this diagonal is therefore connected to fibre B7 (bottom left corner). Similarly diagonal C comprises six such fibre elements (C0 to C5) and this is connected to fibre elements C6 and C7. The process is repeated so that all diagonals comprise 8 elements. (However, this connection system can be scaled to any size of array). For example, a 256 fibre array comprising 16 rows and 16 columns would be connected using 16 diagonals. A generalised N fibre array therefore contains square root (N) diagonals.

Referring to the 64 fibre array shown in FIG. 15, the 8 rows and 8 columns of the orthogonal capacitor sensing tracks are each connected to 8 parallel differential amplifier detection circuits, such that capacitants is sensed along all rows and columns simultaneously; 1 detection circuit per row and 1 detection circuit per column. The capacitor tracks need not be orthogonal, alternative angles can be used as long as the tracks cross. As the excitation signal is applied along the diagonal and to only one diagonal at a time, only one unique element in a row or column generates a capacitive feedback signal when detected by the capacitive feedback circuitry. Thus for the present case of 64 elements, for each diagonal excitation, 8 capacitive feedback signals are read in parallel from each row and column. The outputs are connected to an 8 channel ADC unit, one for the rows and one for the columns.

Note also that for very large arrays, the time to sense all elements with the capacitive feedback system is limited by the time take to excite and scan each diagonal. Improved switching time can be achieved by sub-dividing larger fibre arrays into sub-sections, where, for example, a 256 element array can be split into 4 smaller separate readout arrays. This approach is scalable to any array size.

In order to provide a further improvement, a collimating lens can be attached to or integral with the end of the optical fibre to provide a wider angular spread of the emergent beam. In this case, both the lens and fibre move together which simplifies the design enabling rapid switching speed for a high port count. These collimating lenses can be used independently, i.e. with other switching assemblies, but they are especially useful when used together with the miniaturised 'foil type' or 'monolithic type' of piezo electric material transducers described above.

As the fibre end and lens array can both result in back reflection (even when all faces are coated with multi-layer dielectric anti-reflection coatings), some signal loss is incurred. Furthermore, coupling efficiency between fibre ends and collimating optics is critically dependent on maintaining the position of the fibre end within the focal plane of the lens. Collimated fibre optics can be used to deal with this problem. Insertion losses and back reflection within optical switch systems can be considerably reduced and construction can be simplified by the use of collimated or integrally lensed fibre optic ends (FIGS. 16a and 16b) in place of fibre optic ends and lens arrays.

Collimated fibre optics 40 are commercially available, they incorporate a collimating lens 40a attached to the single mode fibre optic end portion 5.

Integrally lensed 41 fibre optics may also be used in place of a collimator 40 for all of the present applications discussed here. Integrally lensed fibre optics are formed by treating the fibre optic end in such a way that it forms a micro lens (integral lens fibre optic systems are currently available from some manufacturers of fibre optic systems). The advantage that both of these technologies provide in the present switching application is that the light emanating from the fibre optic end is collimated and parallel without the incorporation of additional discrete optical components such as lens arrays.

Integrally lensed fibre optics may also be made by cementing an appropriate lens to the fibre end. In all cases coated or uncoated components may be used. Collimator based N×N fibre switches (i.e. N input port counts and N output port counts) have the advantage of low insertion loss, excellent cross talk performance and excellent polarisation independence.

Alternatively, fibre optic switching can be achieved in which collimated or integrally based fibre optic ends are incorporated into the N×N switching matrix, thereby precluding the lens array 12 used in the alternative switch structures described above.

Where capacitive feedback is used (as described above) to determine the position of the collimator, the external surface of the collimator is metallised or given a conductive thin film coating.

Connection to the collimator can be made using metallised fibres and capacitive feedback can be used to measure the capacitance between the outer surface of the collimator rather than the metallised fibre optic. However, if integrally lensed optics are used, capacitive coupling is used to measure the capacitance between the sensor pcb and the metallised fibre.

FIG. 17 shows schematically how the collimated or integral lens on the fibre optic end can be incorporated into a monolithic piezo fibre optic switch. This is one simplified solution in which the lens array 12 is replaced by the collimator 40 or integral lens 41. Although not shown in FIG. 17, it is possible that the length of fibre between the top of the monolithic piezo actuator and the collimator may be increased.

To achieve greater angular swing of the collimated optics at the end of the fibre optic it may be mounted in a gimbals type mount 42 that allows the collimator 40 to pivot about its centre point as shown in FIGS. 18-20, to provide movement in x-y axes 43. A flexure joint is preferably used which links the collimator to the extension arm of the piezo actuator as shown, for example, in FIGS. 19 and 21. Both gimbals and flexure joints may be manufactured by a variety of means including patterned foil. FIG. 21 shows how the use of foils coupled with a gimbal arrangement may be used to tilt the collimated or integral lens fibre optic end. In this case the gimbals arrangement may also be made using a patterned foil structure.

FIGS. 19 and 20 show a variant of the collimator mounting scheme in which a tapered piece 44 forms an extension of the piezo tube 8. The extension piece 44 provides mechanical advantage, i.e. it provides greater XY movement of the collimator base than that generated by the piezo tube scanner alone. The extension piece therefore gives mechanical advantage to the piezo actuator movement. (The exit beam is shown as 45 in FIG. 19). The piezo actuator extension rod 44 is tapered to reduce the resonant frequency of the mechanical system.

A key feature of this design is that the extension rod 44 provides extra lateral movement of the XY plane (perpendicular to the fibre axis) of the base of the collimator than that provided by an unextended piezo actuator alone. The advantage of this is that the collimated beam may be swung over a large, angular range for a given piezo movement. This is important as it provides a much wider addressable range for the resulting beam emanating from the collimator, thus enabling much larger switch arrays to be built (i.e. larger N×N switch sizes—higher port counts).

With the monolithic type, the optical fibre passes through the centre of the piezo tube scanner. The complete unit is replicated N time for an N×N switch unit (FIG. 22)—not FIG. 22 shows only the piezo actuators—where the array may be either square or hexagonal/triangular in layout.

Individual piezo actuators are formed by moulding, firing and/or subsequent sawing of the monolithic piezo material, followed by patterning with electrical contacts.

FIG. 20 shows (in exaggerated schematic form), displacement of the fibre actuator assembly. The fibre optic is not shown in this drawing—it passes through the centre of the piezo tube actuator 8.

The collimator gimbals and flexure mount could be manufactured in a number of ways, one route being patterned foils. FIG. 21 shows one possible method of manufacture for the gimbals mount. Alternatively, a meander type foil arrangement may be used to manufacture the flexure mount.

FIG. 23 shows an alternative embodiment of a monolithic type piezo electric material actuator. In this case the fibre optic 5 (shown bent through a right angle) is held fixed in a mounting block 52 which also supports electronic interconnects and capacitive sensing plates (associated respectively with the fixed fibre and the moving lens). These sense lens displacement and provide a feedback control signal (as described above). The lens 50 is supported by a lens mount 51 which is connected to a monolithic type piezo electric material actuator via a connecting lever 53. The isometric view of FIG. 24 shows a clearance hole 54 which enables freedom of movement. FIG. 25 shows a plurality of these actuators mounted on a rigid support plate and PCB 55 for providing drive connections. As shown in FIG. 23*a*, for example, an extension rod 7 terminates in a tapered portion 53 and cylindrical rod-shaped portion 57 which is connected to lens mount 51, (see also FIG. 24). This arrangement is particularly advantageous because collimating lens 50 can have a conductive coating, to act as a capacitor plate and it is conveniently positioned with respect to the fixed mounting block 52, on which can be provided another capacitor plate (eg. in confronting relationship), to provide positional feedback information as a result of capacitive changes. Moreover, this arrangement allows the components to be conveniently located on a capacitive sensing support structure, of laminar form like that described with reference to FIGS. 13*a* and 13*b*. This will also be more apparent from the sub-assemblies shown in FIGS. 29 and 31-34 where the capacitive sensing system includes flat conductive tracks, which are assembled in a laminar form, in a support structure or block, which can conveniently support other components of the switching assembly. This provides both the advantages of capacitive sensing with a compact and robust structure which facilitates manufacture.

FIGS. 26*a*-26*e* are plan views of an example of foil designs for a 64 port foil type switching assembly. These are arranged in layers, insulated from one another, in the sub-assembly of optic fibre bundles.

FIG. 27 is a perspective view of a piezo electric comb structure 2, for a foil type design of switch, showing saw-cuts 60 separating individual actuators 1 and also showing metallised contacts 61, 62, 63. FIG. 27*a* shows how the fingers of the comb structure 2 are attached to respective conductive tracks of a flat flexible connector 2'. The piezo comb includes outer laters forming respective common +V and –V planes and an inner layer forming a control V plane.

Referring to FIG. 27*b*, this schematically illustrates preferred bias-drive for enhancing the lifetime performance of the piezos. This essentially involves never driving either half of piezo bimorphs in such a manner that they could otherwise be depoled. Bias-driving thus increases device longevity. Another advantage is that the number of electrical interconnects to piezo combs can be drastically reduced. Essentially the top electrodes for all elements of the comb are made common, the bottom electrodes for all elements of the comb are also made common and only centre electrodes of the elements need independent control. Thus, for a comb of 8 bimorphs, there are only 8+2 (10) electrical interconnects, rather than 8+8+8 (24).

FIGS. 28*a*-28*e* show plan views of each layer of piezo comb arrays and foil arrangements such as those shown in FIGS. 26*a*-26*e*. These are assembled into a switching assembly as shown in FIGS. 29 and 30. FIG. 29 shows a 5 foil stack 64, piezo combs 2 in a support plate 65 to which electrical connections are made by ribbon cable 66, the components being mounted in a support structure 67. An optic fibre array 5 passes centrally through structure 67, as shown also in the rear view of FIG. 30.

FIGS. 31*a* and 31*b* are cut-away perspective views of a monolithic type of switching array in which monolithic tube type piezo actuators 70 deflect metallised fibre optics 71 that terminate in (or adjacent) collimators 72 mounted in a capacitive sensing feedback board 73; mechanical leverage (like that shown in FIG. 30) being applied by the extension levers 74 (an enlarged view being shown in FIG. 31*c*).

FIGS. 32 and 33 show foil type sub-assemblies in a later stage of completion, and FIG. 34 shows two of the sub-assemblies facing each other across a space in which the beams are projected.

Appendix A

An example of a method of making a monolithic type of piezoelectric transducer is described in more detail below, all electrical connections for steering the fibres are brought out to bonds pads on the edge of the ceramic and three connections each are supplied with voltages to drive them.

First step: Interconnects are laid out on ceramic base. Two layer metallization, out to the array of bonds pads around edge.

Second step: A coarse pattern low temperature ceramic screen is printed and fired.

Third step: Holes in the pattern are plated up, connecting to interconnects beneath.

Fourth step: A piezo slab, of grade used for inkjet print heads or equivalent, suitable for diamond sawing bonded to ceramic base using low melting point alloy.

Fifth step: Holes drilled through (no clear fibre core).

Sixth step: First hexagonal saw, cut step (FIG. 7).

Seventh step: The side of the columns are plated or deep evaporated. Fibre holes also plated or evaporated, as well as back side of ceramic for use as earth connection of fibre holes. Tops of columns demetallised if needed.

Eighth step: Piezo poled under oil, producing radial poling in columns.

Ninth step: Second set of hexagonal sawing, produces final columns (FIG. 7). Need further cut to reduce metal thickness if plated rather than evaporated. Wire bond or solder pads to electrical connectors.

Tenth step: Fibre cores are dropped through (ends already prepared) with device jigged up above flat and locating grid. Drop in UV cure epoxy to each fibre and expose.

Eleventh step: Attach and focus microlens array.

Twelfth step: Assemble back to back with matching array or mirror. Attach fibre tails to connectors.

Number of fibres accessible in hexagonal array given fibre can bend n times the spot separation from the centre point is $n(n=1)*3+1$, i.e. a deflection capability of +/−10 spot sizes gives access to 334 spots—1 334×334 nonblocking switch. To realise this performance, the correct path length needs to be used.

The quality of the lens array is important in achieving diffraction limited gaussian beams needed to maximise performance. Given a high numerical aperture and small field of view used, a single surface parabolic form produces excellent results, built up of multi layer deposited silica and then re-flowed.

Response time is set by the resonant frequency of the columns plus fibre. The shorter and fatter the better (this is an opposite requirement to maximising displacement). Having column getting lighter toward top is good.

Deflection is achieved using this radial poled system radial poled and volts applied between three sides and the centre. Using shear mode deflection avoids need for re-poling (can use prepoled through thickness), but gives much lower deflection. Maximum deflection obtained with multilayer stack poled through thickness, but this needs several layers.

Aid to alignment can be had in the single pack against mirror configuration by using a partially transmissive mirror, and a CCD in the place where the other fibre pack would go. This can be used on line if desired in this configuration, or simply as a set up aid for the electronics to learn the right drive voltages for all locations of all fibres.

FIG. 1 shows a movable optical element 5a with actuating means such as piezoelectric material transducer elements 1a, 1b; 2a, 2b, which when actuated can cause the movement of the optical element which is in this figure in the form of an optical fibre.

FIG. 3 shows strips 9a and 9b which when actuated transmit movement from an actuating means in the form of a piezoelectric actuator to the element in the form of an optical fibre.

A linking means such as that referenced 9c incorporates between 9a and 9c as well as between 9b and 9c a number of narrow portions which act as flexure means which carry the optical element and are compliant with the displacement of the optical element.

FIGS. 20 and 21 show a further optical beam steering arrangement with a movable optical element in the form of a collimator which is carried by flexure means 42 and which are compliant with the displacement of the optical element. This optical beam steering arrangement incorporates actuating means such as a piezo-rod 8 which is joined to a conical rod 44 for connecting the actuating means to the optical element for transmitting movement from the actuating means to the element. In the embodiment of FIGS. 1, 3, 20 and 21 the optical element is either a fibre or a collimator.

The invention also envisages the use in these beam steering arrangements of other forms of optical elements such as fibres, lenses, reflectors, prisms, filters and gratings.

FIG. 19 shows an optical beam steering arrangement where flexure 42 connects to collimator 40 and to any appropriate support structure. Whist in this embodiment optical element 40 is a collimator. The invention envisages other forms of optical elements within the scope of the claims which follow this description. This optical beam steering arrangement comprises actuating means such as rod 8 for causing the movement of element 40 and a unitary assembly having a first connection 44 in the form of a conical rod to a first actuator and a second connection to said optical element which would be the flexure plate between optical rod 44 and collimator 40. This arrangement also has a third connection 42 to a support structure.

FIGS. 1 and 3 also show a number of optical beam steering arrangements comprising: a support structure (which can be seen only in FIG. 1); a movable optical element in the form of an optical fibre 5b or 5a; actuating means for causing the movement of said element in the form of piezo-rods 9a and 9b; and a unitary assembly such as linkage assembly 9a, 9b and 9c which has a first connection 9a to a first actuator 2c, a second connection 6a to the optical component 5a and a third connection 9b in conjunction with 2d to a support structure (visible in FIG. 1).

The embodiment of FIG. 3 comprises strips 9a; linkage means 9c and narrow portions between strips 9a and linkage means 9c which form a compliant coupling which allows the optical element to be displaced from its original position and then allow the arrangement to return resiliently (at least in part) to its original position.

In the embodiment of FIGS. 20 and 21, the optical element is mounted on the support structure through a gimbal where respective parts of the gimbal interact to contribute to the movement of the optical element. This is because the flexures constituting the gimbal are resilient so that when returning to their initial position after displacement these accompany the motion.

We claim:

1. An optical beam steering arrangement, comprising:
a moveable optical element;
a first powered actuator for causing the movement of said optical element in a first direction;
a second powered actuator for causing the movement of said optical element in a second direction, said second direction being substantially orthogonal to said first direction;
a first passive flexure means disposed between said optical element and said first powered actuator for transmitting movement from said first powered actuator to said optical element; and
a second passive flexure means disposed between said optical element and said second powered actuator for transmitting movement from said second powered actuator to said optical element
wherein the second direction is substantially orthogonal to the first direction.

2. An arrangement according to claim 1 in which, said first and second powered actuators for moving said optical element incorporate mechanical leverage means to magnify the movement achieved.

3. An arrangement according to claim 1, wherein said optical element is formed of at least one lens integral with, or fixed to the end of an optical guide, whereby the optical guide and the lens move together.

4. An arrangement according to claim 1, wherein the optical element is selected from the group consisting of a fibre, a lens, a reflector, a collimator, a prism, a filter and a grating.

5. An arrangement according to claim 1 further comprising a position sensor providing a signal indicative of the orientation of the optical element for use in feedback by the first and second powered actuators.

6. An arrangement according to claim 1, wherein the optical element is mounted on a support structure through a gimbal, and respective parts of the gimbal interact to contribute to the movement of the optical element.

7. An optical switch comprising at least one beam steering arrangement according to claim 1.

8. An arrangement according to claim 1, in which said first and second powered actuators for moving the optical element include piezoelectric transducer means.

9. An arrangement according to claim 8, wherein the piezo electric transducer means comprises a comb-like array of piezo transducers for producing orthogonal displacement of said optical element.

10. An arrangement according to claim 8, where the piezo electric transducer means is of a "monolithic type", where said transducer is made of piezo electric material, has a body with a longitudinal axis, and the body has conductive strips aligned with the longitudinal axis so as to define respective portions of the transducer that impart respective transverse motions in different radial directions to provide a resultant motion in the two dimensional plane perpendicular to the longitudinal axis.

11. An optical beam steering arrangement, comprising:
a support structure;
a moveable optical element;
a first powered actuator for causing the movement of said optical element in a first direction;
a second powered actuator for causing the movement of said optical element in a second direction, said second direction being substantially orthogonal to said first direction; and
a unitary assembly comprising:
a first connection from said optical element to said first powered actuator; and
a second connection from said optical element to said second powered actuator.

12. An arrangement according to claim 11, wherein the optical element is mounted on the support structure through a gimbal, and respective parts of the gimbal interact to contribute to the movement of the optical element.

13. An arrangement according to claim 11, wherein the optical element is selected from the group consisting of a fibre, a lens, a reflector, a collimator, a prism, a filter and a grating.

14. An arrangement according to claim 11, wherein said optical element is formed of at least one lens integral with, or fixed to the end of an optical guide, whereby the optical guide and the lens move together.

15. An arrangement according to claim 11, wherein the unitary assembly includes a compliant coupling.

16. An optical switch comprising at least one beam steering arrangement according to claim 11.

17. An arrangement according to claim 11 further comprising a position sensor providing a signal indicative of the orientation of the optical element for use in feedback by the first and second powered actuators.

18. An arrangement according to claim 11, in which said first and second powered actuators for moving the optical element include piezoelectric transducer means.

19. An arrangement according to claim 18, where the piezo electric transducer means is of a "monolithic type", where said transducer is made of piezo electric material, has a body with a longitudinal axis, and the body has conductive strips aligned with the longitudinal axis so as to define respective portions of the transducer that impart respective transverse motions in different radial directions to provide a resultant motion in the two dimensional plane perpendicular to the longitudinal axis.

20. An arrangement according to claim 18, wherein the piezo electric transducer means comprises a comb-like array of piezo transducers for producing orthogonal displacement of said optical element.

21. An arrangement according to claim 11 in which, said first and second powered actuators for moving said optical element incorporate mechanical leverage means to magnify the movement achieved.

* * * * *